US012603137B2

(12) United States Patent
Zhou et al.

(10) Patent No.: US 12,603,137 B2
(45) Date of Patent: Apr. 14, 2026

(54) MEMORY SYSTEMS, OPERATING METHODS, AND READABLE STORAGE MEDIUMS

(71) Applicant: Yangtze Memory Technologies Co., Ltd., Wuhan (CN)

(72) Inventors: Teng Zhou, Wuhan (CN); Hua Tan, Wuhan (CN); Weilin Liu, Wuhan (CN); Qian Sun, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 30 days.

(21) Appl. No.: 18/743,818

(22) Filed: Jun. 14, 2024

(65) Prior Publication Data
US 2025/0285685 A1 Sep. 11, 2025

(30) Foreign Application Priority Data
Mar. 8, 2024 (CN) ......................... 202410268569.X

(51) Int. Cl.
| | |
|---|---|
| *G11C 7/00* | (2006.01) |
| *G11C 16/08* | (2006.01) |
| *G11C 16/26* | (2006.01) |
| *G11C 16/32* | (2006.01) |

(52) U.S. Cl.
CPC .............. *G11C 16/26* (2013.01); *G11C 16/08* (2013.01); *G11C 16/32* (2013.01)

(58) Field of Classification Search
CPC ......... G11C 16/10; G11C 16/30; G11C 16/12; G11C 16/0483; G11C 16/3454
USPC ...................................... 365/189.15
See application file for complete search history.

(56) References Cited

U.S. PATENT DOCUMENTS

| | | | | |
|---|---|---|---|---|
| 2019/0080747 A1* | 3/2019 | Sakurada | ............... | G11C 16/08 |
| 2022/0165337 A1* | 5/2022 | Bhatia | ...................... | G06N 3/08 |

* cited by examiner

*Primary Examiner* — Son T Dinh
(74) *Attorney, Agent, or Firm* — Hanley, Flight & Zimmerman, LLC

(57) ABSTRACT

Examples of the present application disclose memory systems, methods of operating the same, and readable storage mediums. An example memory system includes a memory device and a memory controller coupled to the memory device. The memory controller is configured to: in response to a read command, determine a time period to which a time difference between writing and reading of data to be read corresponding to the read command belongs; determine an amount of the voltage shift according to the time period to which the time difference between the writing and reading of the data to be read belongs; and determine a read voltage for reading the data to be read based on the amount of the voltage shift and the default read voltage.

20 Claims, 28 Drawing Sheets

500 address bit(s)

time node information of SPB :
Slot0 : 0~2min
1min 2 times
first PPA ~ last PPA
Slot1 : 2-10min
++1min 8 times
NA
Slot2 : >10min
NA

FIG. 21

SPB

| first PPA | | |
|---|---|---|
| | | |
| | | |
| | | last PPA |

FIG. 23

SPB

| first PPA | | |
|---|---|---|
| | | |
| | PPA_X1 | |
| | | last PPA |

FIG. 25

SPB

| first PPA | | |
|---|---|---|
| | PPA_X1 | |
| | | |
| | PPA_X2 | last PPA |

FIG. 26

SPB

| first PPA | PPA_X1 | PPA_X2 |
|-----------|--------|--------|
| PPA_X3 | PPA_X4 | PPA_X5 |
| PPA_X6 | PPA_X7 | PPA_X8 |
| PPA_X9 | PPA_X10 | last PPA |

FIG. 27

MEMORY SYSTEMS, OPERATING METHODS, AND READABLE STORAGE MEDIUMS

CROSS-REFERENCE TO RELATED APPLICATION

The present application claims the benefit of priority to China Application No. 202410268569.X, filed on Mar. 8, 2024, the content of which is incorporated herein by reference in its entirety.

FIELD OF TECHNOLOGY

The present application relates to the field of semiconductor technology, and in examples to memory systems, operating methods, and readable storage mediums.

BACKGROUND

A memory device is a storage device used to preserve information in modern information technology. As a typical non-volatile semiconductor memory, a NAND (Not-And) type memory has gradually become a mainstream product in the storage market due to its high storage density, controllable production cost, suitable programming and erasing speed and retention characteristics.

BRIEF DESCRIPTION OF THE DRAWINGS

In the accompanying drawings, which are not necessarily drawn to scale, like reference numerals may describe similar components in the different views. The same number with a different letter suffix may represent different instances of a similar component. The accompanying drawings generally illustrate, by way of example and not limitation, various examples discussed in this document.

FIG. 21 is a structure schematic diagram of time node information provided by an example of the present application;

FIG. 23 is a structure schematic diagram of an SPB fully written with data within 1 minute provided by an example of the present application;

FIG. 25 is a structure schematic diagram of an SPB fully written with data within 1-2 minutes provided by an example of the present application;

FIG. 26 is a structure schematic diagram of an SPB fully written with data within 2-3 minutes provided by an example of the present application;

FIG. 27 is a structure schematic diagram of an SPB fully written with data in more than 10 minutes provided by an example of the present application;

DETAILED DESCRIPTION

Figure 1:
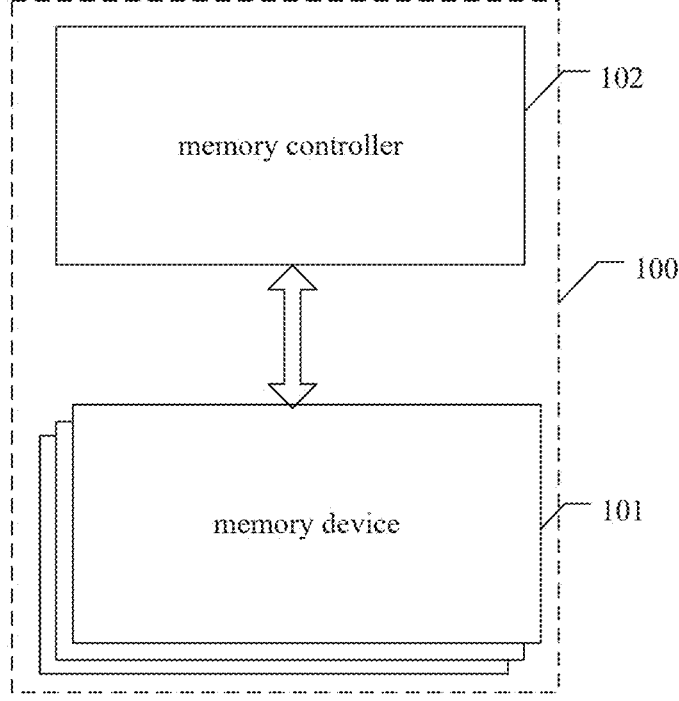
FIG. 1 is a structure schematic diagram of a memory system provided by an example of the present application.

The present disclosure will now be discussed with reference to several example implementations. It is to be understood that these implementations may be implemented in various ways, rather than suggesting any limitations on the scope of the present disclosure. Instead, the providing of these implementations are for the purpose only for enabling those skilled in the art to better understand and thus convey the whole range of the present disclosure may be conveyed to those skilled in the art.

In the following description, numerous specific details are given in order to provide a more thorough understanding of the present application. However, it will be apparent to one skilled in the art that the present application may be practiced without one or more of these details. In other examples, in order to avoid confusion with the present application, some technical features known in the art are not described;

that is, not all features of the actual example are described here, and well-known functions and structures are not described in detail.

In the accompanying drawings, size of a layer, a region, an element and their relative sizes may be exaggerated for clarity. Like reference numerals refer to like elements throughout.

It will be understood that when an element or layer is referred to as being "on," "adjacent to," "connected to" or "coupled to" another element or layer, it may be directly on, adjacent to, connected to or coupled to another element or layer, or intervening elements or layers may be present. In contrast, when an element is referred to as being "directly on," "directly adjacent to," "directly connected to" or "directly coupled to" another element or layer, there is no intervening elements or layers present. It will be understood that, although the terms first, second, third etc., may be used to describe various elements, components, regions, layers and/or parts, these elements, components, regions, layers and/or parts should not be limited by these terms. These terms are only used to distinguish one element, component, region, layer or part from another element, component, region, layer or part. Thus, a first element, component, region, layer or part discussed below may be termed as a second element, component, region, layer or part without departing from teachings of the present application. Whereas a second element, component, region, layer or part is discussed, it does not indicate that a first element, component, region, layer or part necessarily presents in the present application.

The spatially relative terms such as "beneath", "below", "lower", "under", "above", "on", etc., may be used herein for ease of description to describe one element or feature's relationship to another element(s) or feature(s) as illustrated in the figures. It will be understood that the spatially relative terms are intended to encompass different orientations of the device in use or operations in addition to the orientation depicted in the figures. For example, if the device in the appended drawings is turned over, an element or a feature described as "below" or "beneath" or "under" another element or feature would then be oriented "above" the another element or feature. Thus, example terms "below" and "under" may encompass both directions of up and down. A device may be otherwise oriented (rotated 90 degrees or at other orientations) and the spatially relative descriptors used herein should be interpreted accordingly.

A term used herein is for the purpose of describing a particular example only and is not to be considered as limitation of the present application. As used herein, the singular forms "a", "an" and "said/the" are intended to include the plural forms as well, unless the context clearly dictates otherwise. It should also be understood that the terms "consists of" and/or "comprising", when used in this description, identify the presence of stated features, integers, steps, operations, elements and/or parts, but do not exclude the presence or addition of one or more other features, integers, steps, operations, elements, parts and/or groups. As used herein, the term "and/or" includes any and all combinations of the associated listed items.

In order to understand the characteristics and technical content of examples of the present application in more detail, implementations of examples of the present application will be described in detail below in conjunction with the accompanying drawings, however, the accompanying drawings are for reference and description only, and are not intended to limit examples of the present application.

It should be understood that reference throughout the description to "one example" or "an example" means that a particular feature, structure or characteristic related to the example is included in at least one example of the present application. Thus, appearances of "in one example" or "in an example" in various places throughout the description are not necessarily referring to a same example. Furthermore, these particular features, structures or characteristics may be combined in any appropriate manner in one or more examples. It should be understood that in various examples of the present application, sequence numbers of the processes described above do not mean the execution order, and the execution order of each process should be determined by its function and internal logic, and should not constitute any limitation to implementation process of examples of the present application. The serial numbers of examples of the present application described above are for the purpose of description only, and do not represent the advantages and disadvantages of the examples.

The methods disclosed in several method examples provided in the present application may be combined arbitrarily without conflicts to obtain new method examples.

The memory system and operating method thereof provided by the example of the present application determines the time period to which the time difference between the writing and reading of the data to be read belongs, and then determines the amount of the voltage shift according to the time period, and then determines the read voltage for the data to be read according to the amount of the voltage shift and the default read voltage, thus, the IVS effect of the memory cell is actively processed to ensure that the probability of a successful read in one time is relatively high and meet high QoS requirements.

Examples of the present application will be further described in detail below in conjunction with the accompanying drawings and examples.

However, as people's requirements for storage devices continue to increase, there are many aspects for improvement in the memory devices and system thereof.

Referring to FIG. 1, FIG. 1 illustrates a structure schematic diagram of a memory system provided by an example of the present application. As shown in FIG. 1, the memory system 100 may include: a memory device 101 and a memory controller 102 coupled to the memory device. The memory controller 102 is configured to: in response to a read command, determine a time period to which a time difference between writing and reading of data to be read corresponding to the read command belongs; determine the amount of the voltage shift according to the time period to which the time difference between the writing and reading of the data to be read belongs; and determine a read voltage for reading the data to be read based on the amount of the voltage shift and the default read voltage.

Figure 2:
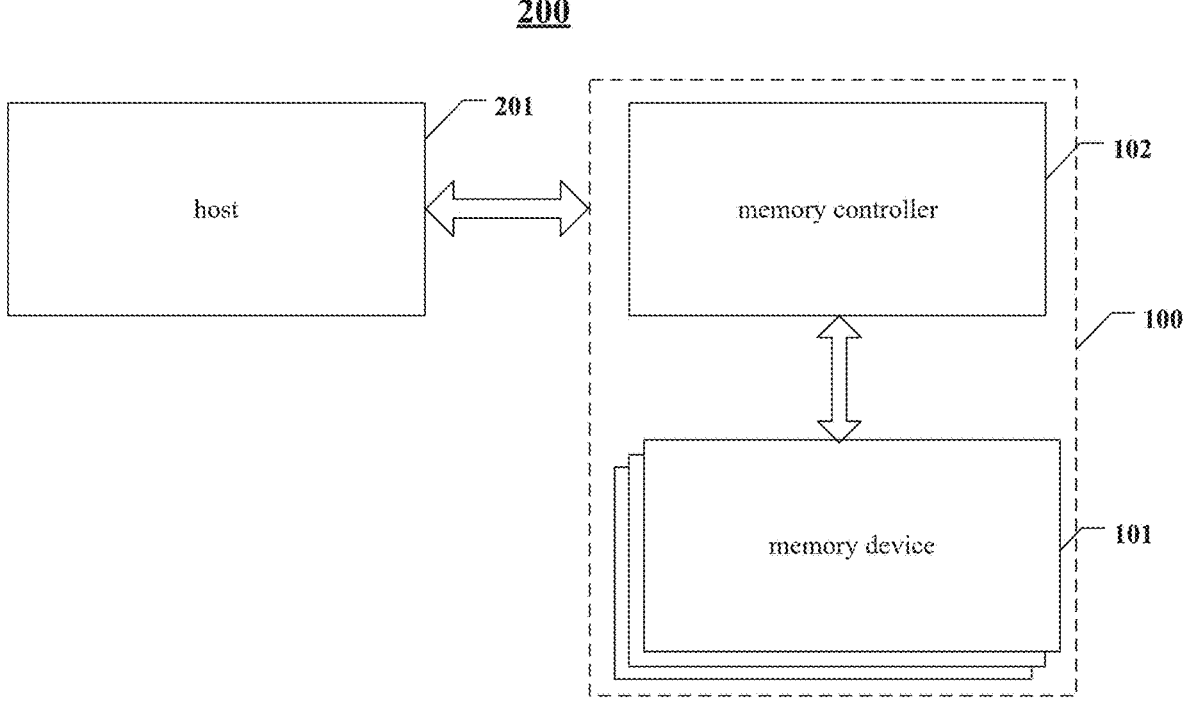
FIG. 2 is a structure schematic diagram of an example system comprising a memory system provided by an example of the present application.

In some implementations, the memory system 100 may communicate with a host. At least one of the host or the memory system 100 may be included in various products, e.g., Internet of Things (IoT) devices, such as refrigerator or other devices, sensor, motor, mobile communication device, automobile, autonomous driving, etc., to support processing, communication or control of products. In some examples, as shown in FIG. 2, FIG. 2 illustrates a schematic diagram of an example system with a memory system provided according to an example of the present application. In FIG. 2, the system 200 may be a mobile phone, a desktop computer, a laptop computer, a tablet, a vehicle computer, a gaming console, a printer, a locating device, a wearable electronic device, a smart sensor, a Virtual Reality (VR) device, an Augmented Reality (AR) device, or any other suitable electronic devices having a memory therein. As shown in FIG. 2, the system 200 may include a host 201 and a memory system 100. The memory system 100 has one or more memory devices 101 and a memory controller 102; the host 201 may be a processor of an electronic device, e.g., a Central Processing Unit (CPU) or a System of Chip (SoC), where the SoC may be, e.g., an Application Processor (AP). Host 201 may be configured to send data to or receive data from memory device 101. In some examples, the memory device 101 may be any memory disclosed in this application. For example, Phase Change Random Access Memory (PCRAM), three-dimensional NAND flash memory, etc.

According to some implementations, memory controller 102 is coupled to memory device 101 and host 201. And the memory controller 102 is configured to control the memory device 101. Memory controller 102 may manage data stored in memory device 101 and communicate with host 201. In some examples, the memory controller 102 is designed to operate in low duty cycle environments, e.g., in Secure Digital (SD) card, Compact Flash (CF) card, Universal Serial Bus (USB) flash drive, or other media for use in electronic devices in low duty cycle environment such as personal computer, digital camera, mobile phone, etc. In some implementations, the memory controller 102 is designed to operate in high duty cycle environments, e.g., Solid State Drive (SSD) or Embedded Multi Media Card (eMMC), where SSD or eMMC is used as data storage for mobile devices in high duty cycle environments such as smartphone, tablet computer, laptop computer, and enterprise storage array. Memory controller 102 may be configured to control operations of memory device 101, e.g., read, erase and program operations. Memory controller 102 may also be configured to manage various functions related to data stored or to be stored in memory device 101, including but not limited to bad block management, garbage collection, logical-to-physical address translation, wear leveling, etc. In some implementations, memory controller 102 is further configured to process Error Correction Code (ECC) related to data read from or written to memory device 101. The memory controller 102 may also perform any other suitable functions, e.g., formatting the memory device 101. Memory controller 102 may communicate with external devices (e.g., host 201) according to a particular communication protocol. For example, the memory controller 102 may communicate with external devices through at least one of various interface protocols, such as USB protocol, MMC protocol, Peripheral Component Interconnect (PCI) protocol, PCI Express (PCI-E) protocol, Advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

Figure 3:
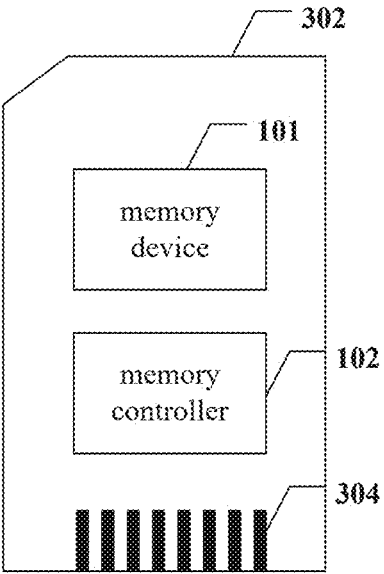
FIG. 3 is a schematic diagram of an example memory card comprising a memory system provided by an example of the present application.
Figure 4:
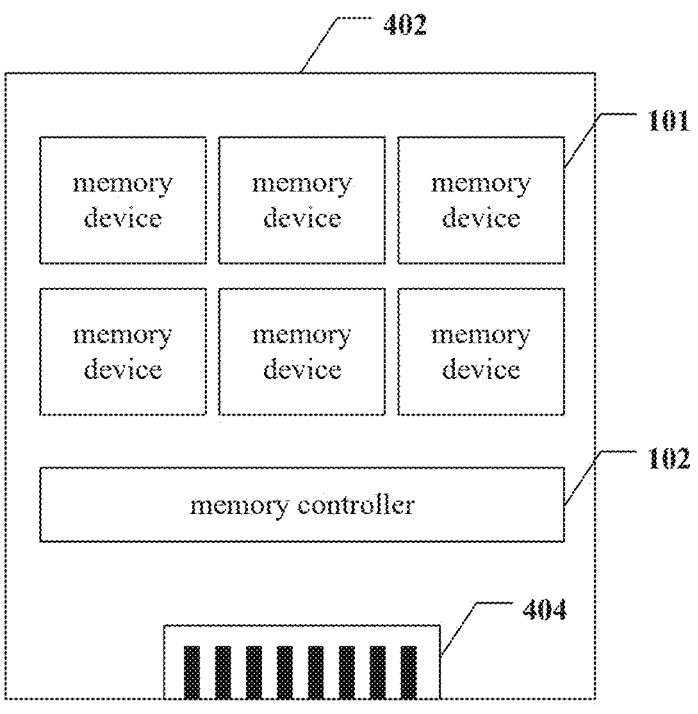
FIG. 4 is a schematic diagram of an example Solid State Drive (SSD) comprising a memory system provided by an example of the present application.

In some examples, a memory controller 102 and one or more memory devices 101 may be integrated into various types of storage devices, e.g., included in the same package (e.g., Universal Flash Storage (UFS) package or eMMC package). That is, memory system 100 may be implemented and packaged into different types of end electronic products. In an example as shown in FIG. 3, memory controller 102 and a single memory device 101 may be integrated into a memory card 302. A memory card may include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card may further include a memory card connector 304 coupling the memory card with a host (e.g., host 201 in FIG. 2). In another example as shown in FIG. 4, memory controller 102 and multiple memory devices 101 may be integrated into a Solid State Drive (SSD) 402. SSD may further include an SSD connector 404 coupling the SSD with a host (e.g., host 201 in FIG. 2). In some implementations, at least one of the storage capacity or operating speed of SSD is greater than at least one of the storage capacity or operating speed of memory card. Additionally, the memory controller 102 may also be configured to control erase, read, and write operations of the memory device 101.

Here, the memory device 101 may refer to a device used to store at least one of program or data, which may include a the array of memory cells and peripheral circuits, and the array of memory cells may be used as a storage medium to store at least one of program or data, and the peripheral circuit is a general term for various circuits used to control the array of memory cells and store at least one of program or data in the array of memory cells.

Figure 5:
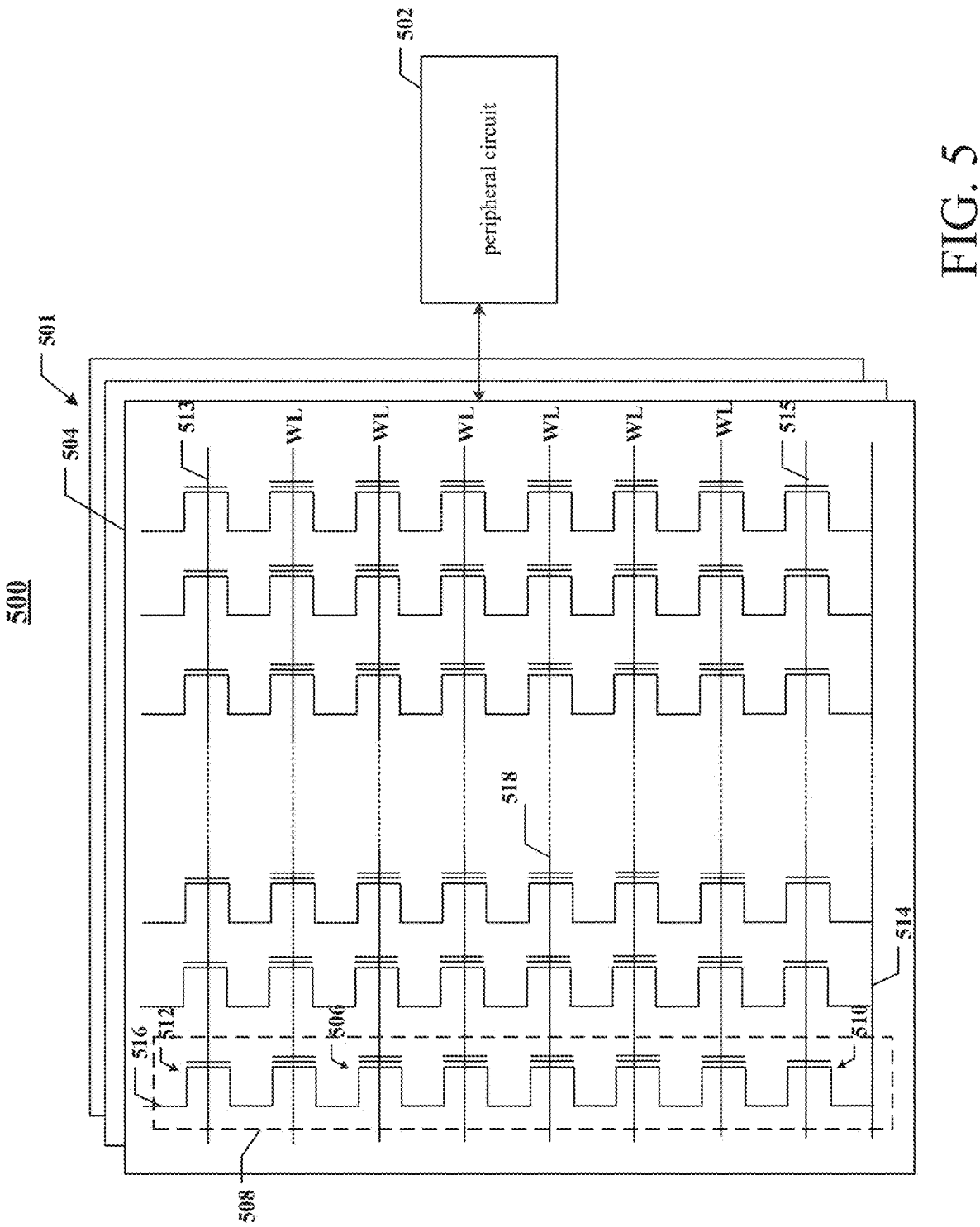
FIG. 5 is a structure schematic diagram of an example memory device including a peripheral circuit and the array of memory cells provided by an example of the present application.

For example, as seen in FIG. 5, FIG. 5 shows a structure schematic diagram of a memory device 500 including peripheral circuits and a the array of memory cells. As shown in FIG. 5, the memory device 500 may be a NAND flash memory device, which is an example of the memory device 101 in FIG. 1, and includes a the array of memory cells 501 and a peripheral circuit 502. The memory cells 506 of the array of memory cells 501 are provided in the form of an array of NAND memory strings 508, each NAND memory string 508 extending vertically over a substrate (not shown). In some examples, each NAND memory string 508 includes a plurality of memory cells 506 coupled in series and stacked vertically. Each memory cell 506 may retain a continuous analog value, e.g., voltage or charge, depending on the number of electrons trapped by the memory cell 506. Each memory cell 506 may be a "floating gate" type memory cell including a floating gate transistor, or a "Charge Trap (CT)" type memory cell including a charge trap transistor. For a charge trap type memory cell, this type of memory cell may be programmed based on a charge trapping method, and the storage information of the memory cell depends on the amount of charge trapped in the storage layer. However, during programming, there are fast charges, that is, charges trapped in shallow traps, which are easily lost, and may cause the threshold voltage of the memory cell to shift in a time period after programming, that is, fast charge loss, also known as the IVS effect. Due to the existence of the IVS effect, in actual applications, the program state immediately after writing cannot reflect the target threshold voltage of the memory cell. In this case, the read operation will have higher error bits. Therefore, in the present application, it is intended to solve the problem of high read errors caused by the IVS effect of a charge trap type memory cell. An example of the implementation will be described in detail later.

Returning to FIG. 5, in some examples, each memory cell 506 is a Single Level Cell (SLC) that has two possible data states and therefore may store one bit of data, e.g., the first data state "0" may correspond to the first voltage range, and the second data state "1" may correspond to the second voltage range. In some examples, the first voltage range and the second voltage range may be referred to as threshold voltage distribution of the memory cell. In some examples, each memory cell 506 may be a Multi Level Cell (MLC), e.g., the MLC may store two bits per cell (also referred to as a Double Level Cell (DLC)); as another example, each cell stores three bits (also referred to as a Trinary Level Cell (TLC)); as still another example, each cell stores four bits (also referred to as a Quadruple Level Cell (QLC)). Among them, the data state of any type of memory cell includes an erase state and (one or more) program state, and when performing a program operation on a memory cell, the memory cell in the erase state is programmed to a certain program state. Generally speaking, the voltage value in the voltage range corresponding to the program state of the memory cell is relatively large.

As shown in FIG. 5, each NAND memory string 508 may include a source select gate (SSG) 510 at its source terminal and a drain select gate (DSG) 512 at its drain terminal. SSG 510 and DSG 512 may be configured to activate selected NAND memory cell string 508 (columns of the array) during read operation and program (or write) operation. In some examples, the sources of NAND memory strings 508 in a same memory block 504 are coupled through a same source line (SL) 514 (e.g., a common SL). In other words, according to some implementations, all NAND memory strings 508 in a same memory block 504 have an array common source (ACS). According to some implementations, DSG512 of each NAND memory string 508 is coupled to a corresponding bit line 516 from which data may be read and written via an output bus (not shown). In some examples, each memory string 508 is configured to be selected or deselected through at least one of applying a select voltage (e.g., above the threshold voltage of a transistor with DSG512) or a deselect voltage (e.g., 0 Volts (V)) to the corresponding DSG512 via one or more Drain Selective Lines or Top Selective Lines 513 or applying a select voltage (e.g., above the threshold voltage of a transistor with SSG510) or a deselect voltage (e.g., 0V)) to the corresponding SSG510 via one or more Source selective lines or Bottom selective lines 515.

As shown in FIG. 5, NAND memory string 508 may be organized into a plurality of memory blocks 504 each of which may have a common source line 514 (e.g., coupled to ground). In some examples, each memory block 504 is the basic data unit with an erase operation, i.e., all memory cells 506 on the same memory block 504 are erased simultaneously. To erase the memory cell 506 in the selected memory block 504, the source line 514 coupled to the selected memory block 504 and to the unselected memory blocks 504 in the same plane as the selected memory block 504 may be biased with an erase voltage (Vers) (e.g., a high positive voltage 20V or higher). It should be understood that, in some examples, erase operations may be performed at the half-block level, at the quarter-block level, or at a level with any suitable number of blocks or any suitable fraction of blocks. As shown in FIG. 5, memory cells 506 of adjacent NAND memory strings 508 may be coupled through word line 518, that is, the same word line 518 may be coupled to the memory cells at the same location (i.e., corresponding memory cells) in multiple memory strings.

Figure 6:
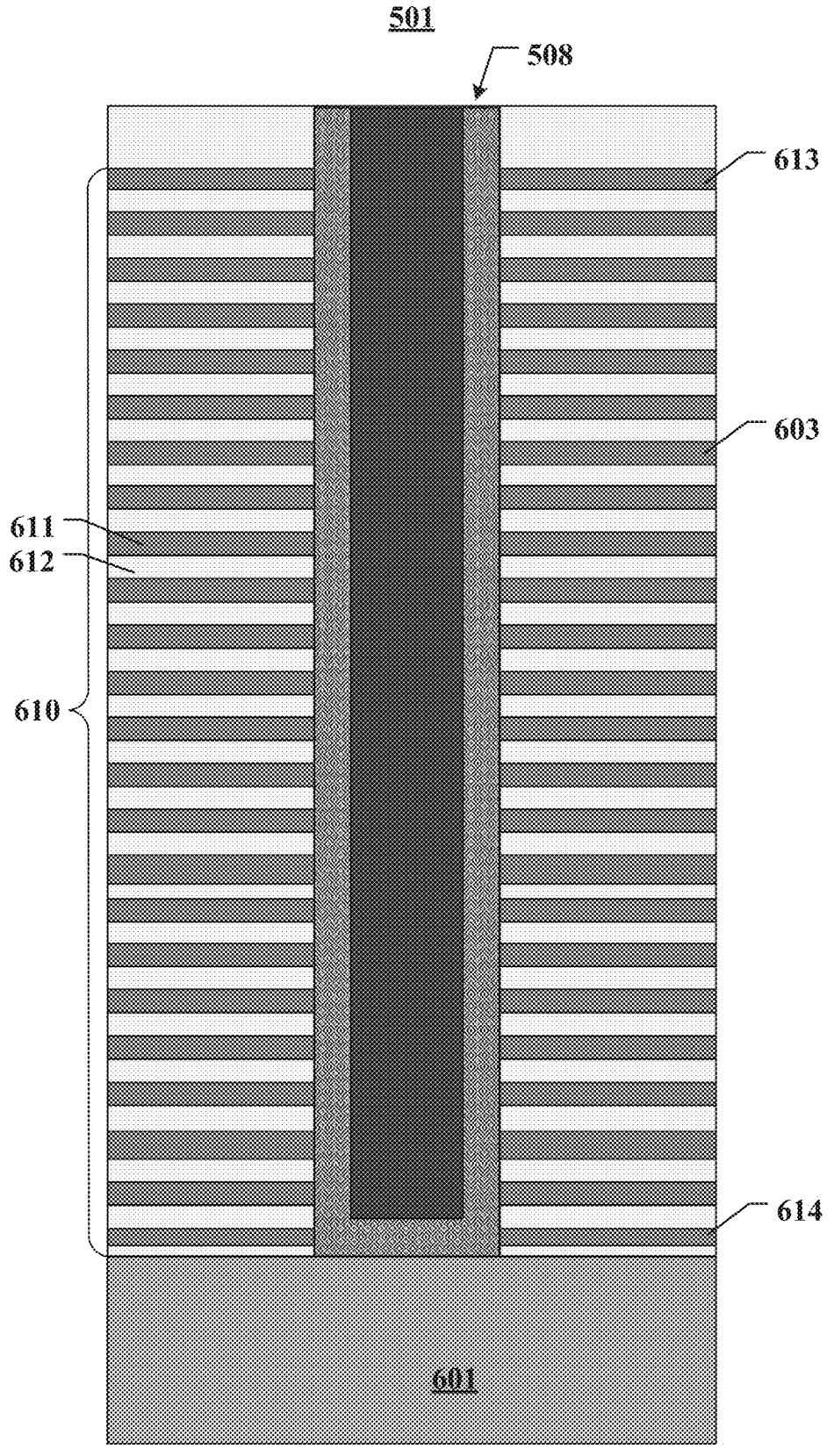
FIG. 6 is a schematic cross-sectional view of an example memory array including NAND memory strings provided by an example of the present application.

FIG. 6 illustrates a side view of a cross-section of an example the array of memory cells 501 including NAND memory string 508 according to some aspects of the present application. As shown in FIG. 6, the NAND memory string 508 may include a stacked structure 610, the stacked structure 610 includes a plurality of gate layers 611 and a plurality of insulating layers 612 alternately stacked in sequence, and memory string 508 vertically penetrating through gate layers 611 and insulating layers 612. Gate layers 611 and the insulating layers 612 may be stacked alternately, and two adjacent gate layers 611 are separated by an insulating layer 612. The number of pairs of gate layer 611 and insulating layer 612 in the stacked structure 610 may determine the number of memory cells included in the array of memory cells 501.

A constituent material of the gate layer 611 may include a conductive material. Conductive materials include, but are not limited to, tungsten (W), cobalt (Co), copper (Cu), aluminum (Al), polysilicon, doped silicon, silicide, or any combination thereof. In some examples, each gate layer 611 includes a metal layer, e.g., a tungsten layer. In some examples, each gate layer 611 includes a doped polysilicon layer. Each gate layer 611 may include a control gate surrounding a memory cell. The gate layer 611 at the top of the stacked structure 610 may laterally extend as top select gate line 613, i.e., TSG line 513, where the top select gate line 613, i.e., the previously described drain select gate (DSG) 512 lead wire, to access the corresponding select voltage or deselect voltage; the gate layer 611 at the bottom of the stacked structure 610 may laterally extend as bottom select gate line 614, i.e., source selective line or bottom selective line 515, where the bottom select gate line 614, i.e., the previously described source select gate (SSG) 510 lead wire, to access the corresponding select voltage or deselect voltage. The gate layer 611 extending laterally between the top select gate line and the bottom select gate line may serve as word line layers 603, and these word line layers 603 are the word lines 518 described above.

In some examples, a stacked structure 610 may be disposed on a substrate 601. The substrate 601 may include silicon (e.g., monocrystalline silicon), silicon germanium (SiGe), gallium arsenide (GaAs), germanium (Ge), silicon-on-insulator (SOI), germanium-on-insulator (GOI), or any other appropriate material.

In some examples, NAND memory string 508 includes a channel structure extending vertically through stacked structure 610. In some implementations, a channel structure includes a channel hole filled with semiconductor material(s) (e.g., as a semiconductor channel) and dielectric material(s) (e.g., as a memory film). In some implementations, a semiconductor channel includes silicon, e.g., polysilicon. In some implementations, a memory film is a composite dielectric layer including a tunneling layer, a storage layer (also referred to as a "charge trapping/storage layer"), and a blocking layer. A channel structure may have a cylindrical shape (e.g., a pillar shape). According to some implementations, a semiconductor channel, a tunneling layer, a storage layer and a blocking layer are radially arranged in this order from the center of the pillar toward the outer surface of the pillar. A tunneling layer may include silicon oxide, silicon oxynitride, or any combination thereof. A storage layer may include silicon nitride, silicon oxynitride, or any combination thereof. A barrier layer may include silicon oxide, silicon oxynitride, a high-k (high-k) dielectric, or any combination thereof. In an example, a memory film may include a composite layer of silicon oxide/silicon oxynitride/silicon oxide (ONO).

Figure 7:
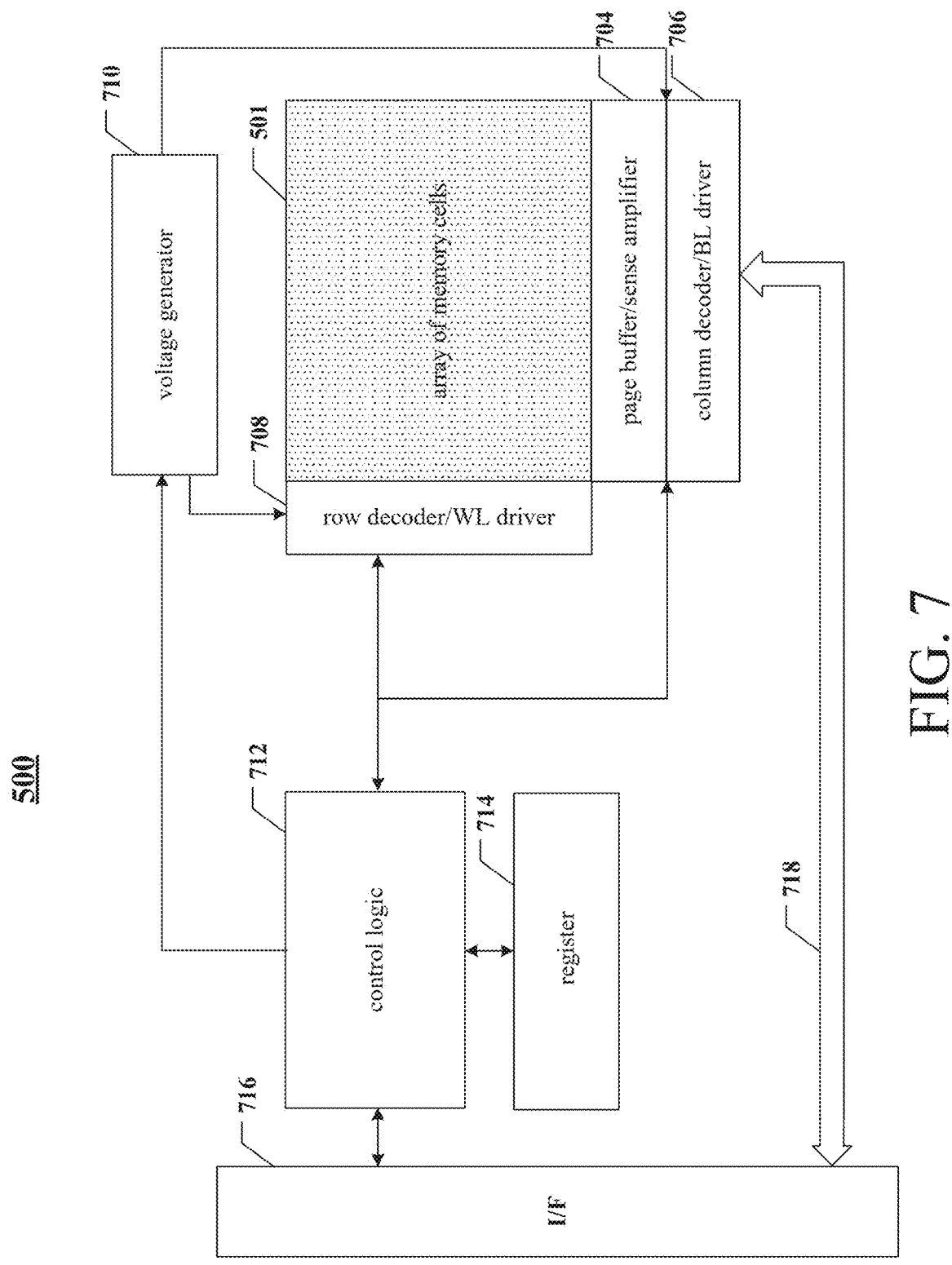
FIG. 7 is a structure schematic diagram of a peripheral circuit provided by an example of the present application.

Referring back to FIG. 5, the peripheral circuit 502 may be coupled to the array of memory cells 501 through bit line 516, word line 518, source line 514, SSG line 515, and DSG line 513. The peripheral circuit 502 may include any suitable analog, digital, and mixed-signal circuitry for facilitating operation of the array of memory cells 501 through at least one of applying a voltage signal or a current signal to and sensing at least one of voltage signal or current signal from each target memory cell 506 via bit line 516, word line 518, source line 514, SSG line 515, and DSG line 513. The peripheral circuit 502 may include various types of peripheral circuits formed with metal-oxide-semiconductor (MOS)

technology. For example, FIG. 7 illustrates some example peripheral circuits, peripheral circuit 502 includes page buffer/sense amplifier 704, column decoder/bit line driver 706, row decoder/word line driver 708, voltage generator 710, control logic unit 712, register 714, interface 716 and data bus 718. It should be understood that in some examples, additional circuits not shown in FIG. 7 may also be included.

In some examples, the page buffer/sense amplifier 704 may be configured to read data from and program (write) data to the array of memory cells 501 according to control signals from the control logic unit 712. In one example, the page buffer/sense amplifier 704 may store program data (or referred to as written data) to be programmed into memory cells coupled to a word line in the array of memory cells 501. In another example, page buffer/sense amplifier 704 may perform a programming verify operation to ensure that data has been correctly programmed into memory cell 506 coupled to selected word line 518. In yet another example, page buffer/sense amplifier 704 may also sense a low power signal from bit line 516 representing a data bit stored in memory cell 506 and amplify a small voltage swing to a recognizable logic level during a read operation. Column decoder/bit line driver 706 may be configured to be controlled by control logic unit 712 and to select one or more NAND memory strings 508 through applying a bit line voltage generated from voltage generator 710.

The row decoder/word line driver 708 may be configured to be controlled by control logic unit 712 and select/deselect memory block 504 of the array of memory cells 501 and select/deselect word line 518 of memory block 504. Row decoder/word line driver 708 may also be configured to drive word line 518 with a word line voltage generated from voltage generator 710. In some implementations, the row decoder/word line driver 708 may also select/deselect and drive the SSG line 515 and the DSG line 513. As described in detail below, the row decoder/word line driver 708 is configured to perform erase operations on the memory cells 506 coupled to the selected word line 518. The voltage generator 710 may be configured to be controlled by the control logic unit 712, and generate word line voltage (e.g., read voltage, programming voltage, pass voltage, local voltage, verify voltage, etc.), bit line voltage and source line voltage to be supplied to the array of memory cells 501.

Control logic unit 712 may be coupled to each of the circuits described above and configured to control operations of each of the peripheral circuits. Register 714 may be coupled to the control logic unit 712 and include status register, command register and address register for storing status information, command operation code (OP code) and command address for controlling operations of each of the peripheral circuits. Interface 716 may be coupled to control logic unit 712 and act as a control buffer to buffer and relay control commands received from a host (not shown) to control logic unit 712 and to buffer and relay status information received from the control logic unit 712 to the host. Interface 716 may also be coupled to column decoder/bit line driver 706 via data bus 718 and act as a data I/O interface and data buffer to buffer and relay data to/from the array of memory cells 501.

Figure 8:
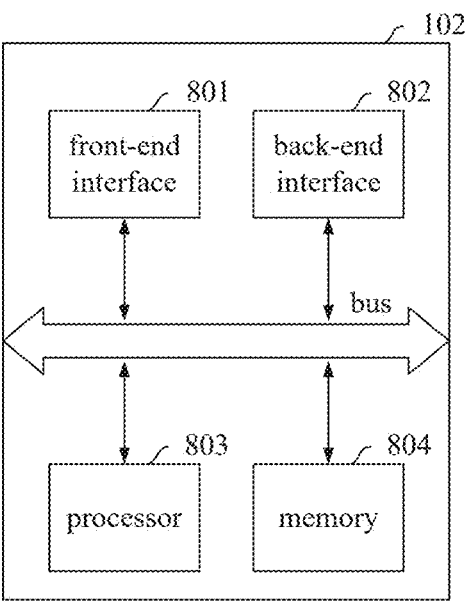
FIG. 8 is a structure schematic diagram of a memory controller provided by an example of the present application.

For the memory controller 102, referring to FIG. 8, FIG. 8 shows an example structure schematic diagram of the memory controller 102 provided by an example of the present application. As shown in FIG. 8, the memory controller 102 may include a front-end interface 801, a back-end interface 802, a processor 803, and a memory 804. The above-mentioned components 801, 802, 803, and 804 in the memory controller 102 may share transmission signals inside the memory controller 102 through an internal bus. In some examples, the front-end interface 801 may interface the host with the memory system in response to the protocol for the host coupled to the memory system 100, and the front-end interface 801 exchanges transmission commands and data operations between the host and the memory system 100. The front-end interface 801 may process commands and data sent by the host, and may include at least one of Universal Serial Bus (USB), MultiMedia Card (MMC), Peripheral Component Interconnect Express (PCI-e or PCIe), Small Computer System Interface (SCSI), Serial SCSI (SAS), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE). In some examples, the front-end interface 801 is a component of the memory system 100 for exchanging data with the host and may be implemented by firmware referred to as Host Interface Layer (HIL).

Back-end interface 802 may be an interface for commands and data transferred between memory controller 102 and the coupled memory device, allowing memory controller 102 to control the coupled memory device in response to requests communicated from the host. The back-end interface 802 may generate control signals for controlling the coupled memory device. In some examples, if the coupled memory device is a NAND flash memory, the back-end interface 802 may write data into the coupled memory device or read data from the coupled memory device under the control of the processor 803. The back-end interface 802 may process commands and data between the memory controller 102 and the coupled memory device, e.g., operations of a NAND flash interface, especially operations between the memory controller 102 and the coupled memory device. According to an example, the back-end interface 802 may be implemented as a component for exchanging data with the coupled memory device through firmware referred to as Flash Interface Layer (FIL).

The processor 803 may be implemented by a microprocessor or a central processing unit (CPU). The memory system 100 may include one or more processors 803. The processor 803 may control all the operations of the memory system 100. By way of example and not limitation, the processor 803 may control a program operation or a read operation of the coupled memory device in response to a write request or a read request from the host. According to an example, the processor 803 may use or run firmware to control all the operation of the memory system 100. In the present application, a firmware may be referred to as a Flash Translation Layer (FTL). The FTL may operate as an interface between the host 108 and the coupled memory device. The host may transmit requests related to write operations and read operations to the coupled memory device through the FTL. For example, the memory controller 102 uses the processor 803 when performing an operation requested from the host in the coupled memory device. A processor 803 coupled to the memory device may process instructions or commands related to commands from the host. The memory controller 102 may perform a foreground operation such as a command operation corresponding to a command input from the host, e.g., a program operation corresponding to a write command, a read operation corresponding to a read command, and an erase/discard operation corresponds to an erase/discard command, and a parameter set operation corresponds to a set parameter command or a set feature command with a set command.

For another example, the memory controller 102 may perform background operations on the coupled memory device through the processor 803. By way of example and not limitation, these background operations include Garbage Collection (GC) operation, Wear Leveling (WL) operation, and bad block management operation that checks or searcher for bad blocks. The garbage collection operation may include an operation of copying and processing data stored in a memory block in the memory device to another memory block. The wear leveling operation may include an operation of exchanging and processing stored data among memory blocks of the memory device. The bad block management operation may include checking and processing bad blocks in memory blocks of the coupled memory device.

The memory 804 may be a working memory of the memory controller 102 configured to store data for driving the memory controller 102. More in some examples, when the memory controller 102 controls the memory device in response to a request from the host, the memory 804 may store firmware driven by the processor 803 and data (e.g., metadata) required to drive the firmware.

The memory 804 may also be a buffer memory of memory controller 102 configured to temporarily store write data transferred from host into the coupled memory device and read data transferred from the coupled memory device to host. The memory 804 may include program memory, data memory, write buffer/cache, read buffer/cache, data buffer/cache, and mapping buffer/cache for storing write data and read data. The memory 804 may be implemented with volatile memory. The memory 804 may be implemented with Static Random Access Memory (SRAM), Dynamic Random Access Memory (DRAM), or both.

Although FIG. 8 shows the memory 804 being included in memory controller 102, the present application is not limited thereto. In an implementation, the memory 804 may be included external to the memory controller 102, and the memory controller 102 may input and output data to and from the memory 804 through a separate memory interface (not shown). In some examples, the host allocates a portion of space in the memory for use by the SSD, and the memory controller of the SSD calls a portion of the host memory through the front-end interface to use as its own memory, i.e., Host Memory Buffer (HBM) technology.

Based on the structures of the memory device and memory controller described above, in an example of the present application, the memory controller 102 may be configured to: receive a read command, and in response to the read command, determine a time period to which a time difference between writing and reading of the data to be read belongs; the time period to which the time difference between the writing and reading of the data to be read belongs is to reflect the IVS degree of the memory cell storing the data to be read. Furthermore, the amount of the voltage shift is determined according to the time period to be belonged to; further, the read voltage for reading the data to be read is obtained based on the amount of the voltage shift and the default read voltage. That is, according to the time interval between writing data and reading data, the impact period of the IVS effect is determined, and then corresponding appropriate read option is employed according to the influence period of this IVS effect (that is, the default read voltage is shifted to obtain a suitable read voltage), to ensure a greater probability of read success.

Figure 9:
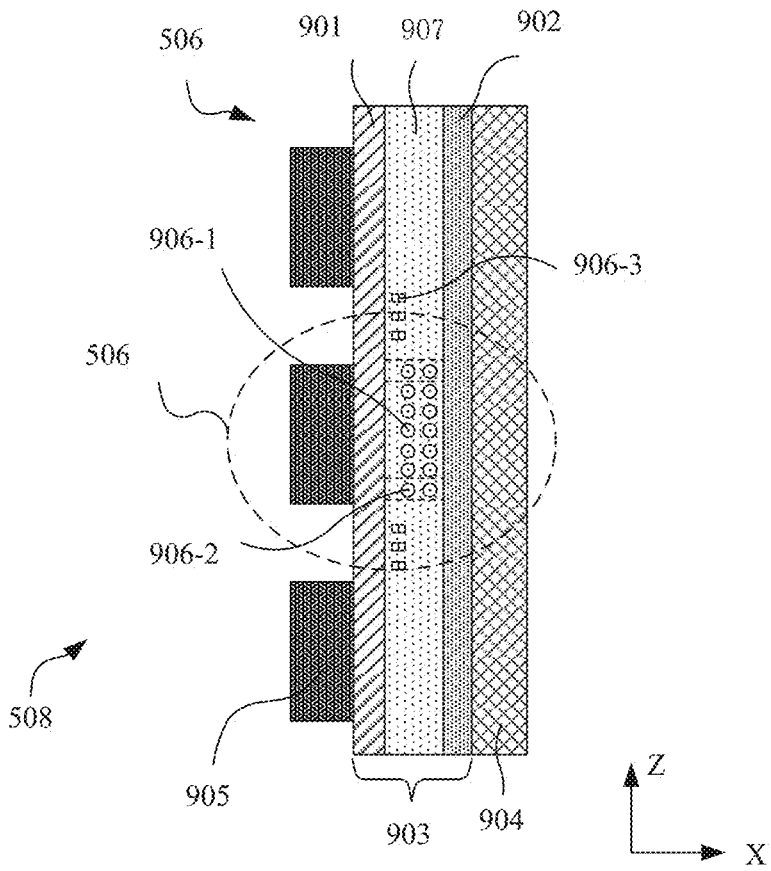
FIG. 9 is a schematic diagram of a trap-type memory cell storing data provided by an example of the present application.

For CT type memory cells, due to the manufacturing process of the memory device or other reasons, the ability to prevent electrons from escaping from the tunnel layer during data retention process becomes weaker, thereby reducing device performance, especially severe IVS effects and poor data retention. The IVS effect may refer to the threshold voltage change in a short time (usually within 1 second(s)). In some examples, please refer to the structure schematic diagram of a CT type memory cell as shown in FIG. 9. It includes a memory cell 506, a barrier layer 901, a tunnel layer 902, a memory film 903, a channel layer 904, and a control gate 905 of the memory cell 506. In programming (i.e., writing) a device, a high positive voltage pulse may be applied to the control gate 905 so that charges 906 (such as electrons) may be injected into the storage layer 907 of the memory cell 506. In the storage layer, charges may be trapped randomly by deep or shallow traps. After programming, the threshold voltage VT of the memory cell 506 may be raised to a higher value than the threshold voltage of the erase state. At a higher threshold voltage VT, the current flowing through the source and drain terminals of the memory cell may be at a reduced level for a given bias on the word line. By measuring (e.g. reading) the current of the memory cell, the threshold voltage of the memory cell and thus the state of the memory cell may be determined accordingly. For a memory cell in a program state, charges located near the control gate 905 may affect the threshold voltage of the memory cell, such as 906-1 or 906-2; charges located outside the electric field of the control gate, such as 906-3, have less influence on the threshold voltage of the memory cell. Based on the previous description, since the charges trapped by shallow traps in the storage layer may be easily released, thus may cause the threshold voltage of the memory cell to shift in a time period after programming, that is, fast charge loss, also known as the IVS effect. Due to the existence of the IVS effect, in actual applications, the program state immediately after writing cannot reflect the target threshold voltage of the memory cell. In this case, the read operation will have higher error bits. Therefore, in the example of the present application, when data needs to be read, after receiving the read command, the memory controller first determine the time period in which the time difference between writing and reading is located that reflects the IVS degree, then obtain the voltage shift according to the determined time period, and combine it with the default read voltage to obtain the appropriate read voltage, thus, the IVS effect is actively processed, thereby increasing the probability of a successful read and meeting QOS requirements of the user.

It should be noted that the default read voltage described above may be the reference read voltage in the Read Retry Table (RRT), or it may be the read voltage stored in the memory device when it leaves the factory. In actual application, the default read voltage may be selected according to the actual application scenario. No excessive introduction here.

Based on the inventive concept described above, in some examples, the memory controller may also be configured to: determine the amount of the voltage shift according to the time period to which the time difference between the writing and reading of the data to be read belongs and a mapping relationship; the mapping relationship includes multiple sub-mapping relationships, and each sub-mapping relationship includes a corresponded relationship between a time period and a corresponding amount of the voltage shift.

It should be noted that after obtaining time period to which the time of writing and reading of the data to be read belongs, the corresponding amount of the voltage shift is obtained according to the pre-stored mapping relationship. The pre-stored mapping relationship may include multiple sub-mapping relationships, and each sub-mapping relationship includes a corresponded relationship between a time period and a corresponding amount of the voltage shift. As described above, the time period is to reflect the IVS degree corresponding to the memory cell storing data in the memory device; accordingly, the time period to which the time difference between the writing and reading of the data to be read belongs is to reflect the IVS degree of the memory cell storing the data to be read. After obtaining the time period in which the time difference between the writing and reading of the data to be read is located is obtained, the amount of the voltage shift corresponding to the time period is obtained from the mapping relationship, that is, the amount of the voltage shift to be obtained.

For the determination of the time period to which the time difference between the writing and reading of the data to be read is located belongs, several different examples are used for illustration below.

In some examples, the memory controller may be further configured to: check the program location in which the memory device is located every first preset time duration, and when different program locations are checked, store the program address information for the different program locations in the first queue according to the sequence for checking. The memory controller may be further configured to in response to the read command, determine the time period to which the time difference between the writing and reading of the data to be read belongs according to the program address information in the first queue and the read address information corresponding to the read command.

Figure 10:
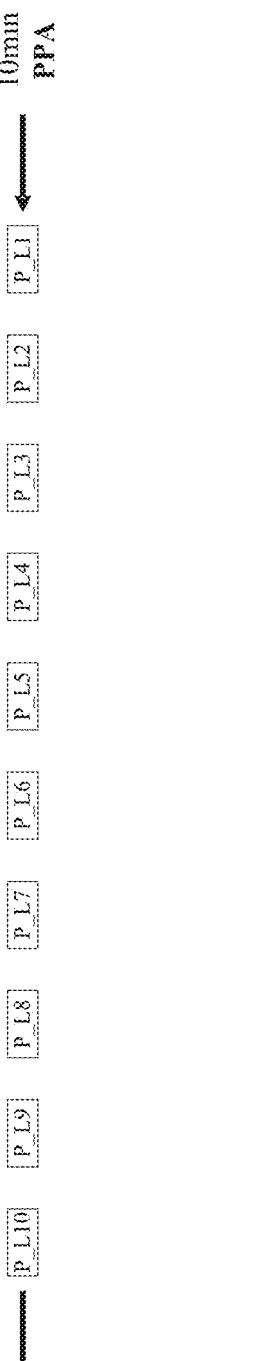
FIG. 10 is a structure schematic diagram of a first queue provided by an example of the present application.

In some examples, the scheme described above may be understood as: the memory controller globally records and updates the latest M (n) program locations every first preset time duration, and the program address information corresponding to these program locations are P_Ln, . . . , P_L9, . . . P_L2, P_L1 from far to near in time, and are recorded in the first queue. For example, as shown in FIG. 10, the memory controller globally records and updates the latest M (10) program locations every 1 minute (min), and the time from far to near is P_L10, P_L9, . . . , P_L2, P_L1. It should be understood that the meaning of from far to near described here may refer to the relationship of distance from the current time. The program location corresponding to the program address information that is further away from the current time is written with data earlier; the program location corresponding to the program address information that is closer to the current time is written with data later.

The program address information may be the address information for the memory page into which data is written, and the program address information may be referred to as PPA. In fact, since in different memory systems, the arrays of memory cells contained in the memory devices have different capacities, in this case, the division of the array of memory cells in logical is different, thus the content contained in the program address information is different.

Figure 11:
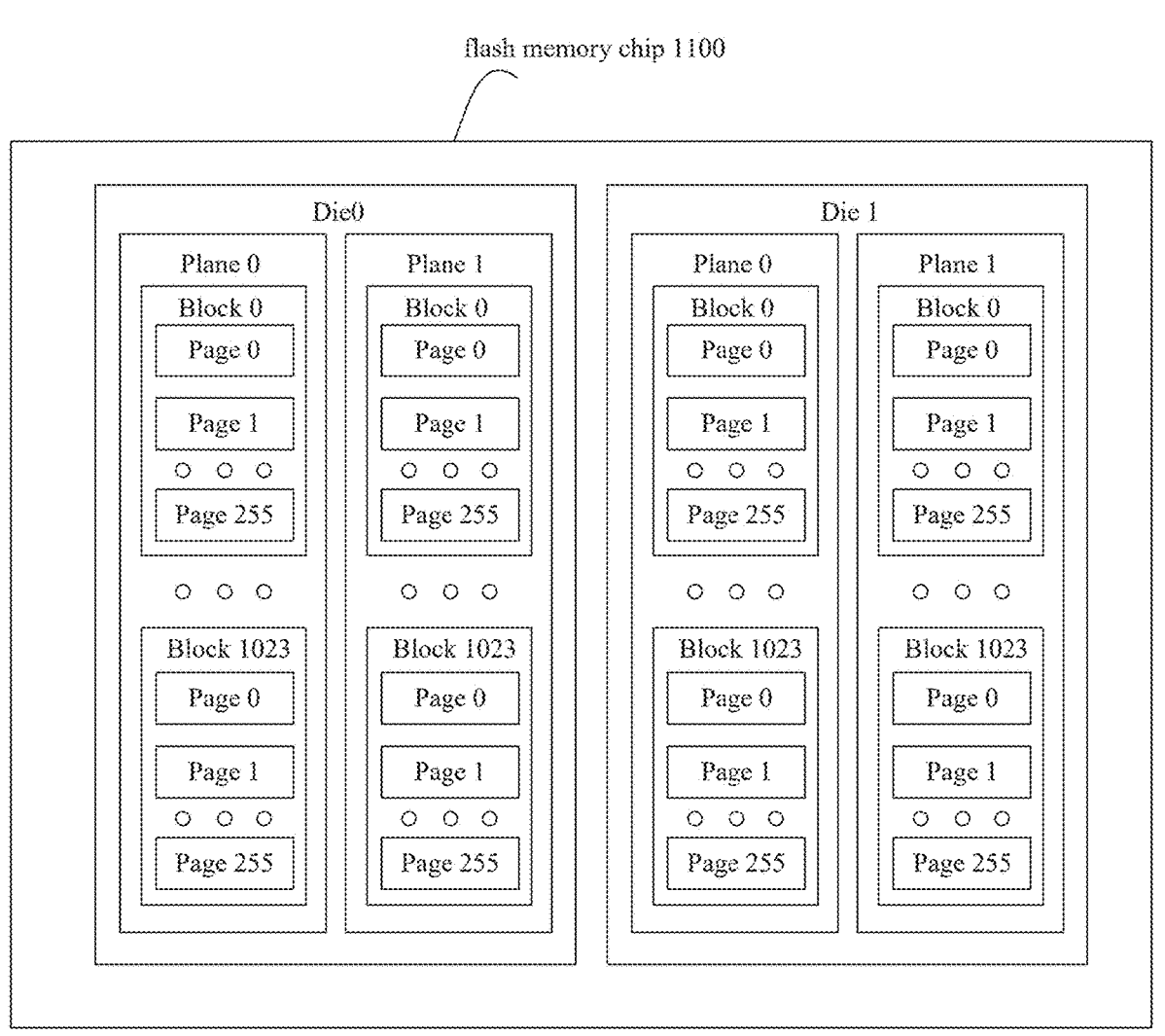
FIG. 11 is a schematic diagram of the organizational structure of the array of memory cells of NAND flash memory provided by an example of the present application.
Figure 12:
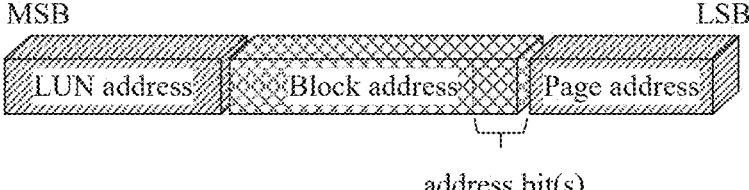
FIG. 12 is a structure schematic diagram of row address information provided by an example of the present application.

For example, as shown in FIG. 11. It illustrates an internal architectural schematic diagram of a NAND flash memory chip provided according to an example of the present application. In FIG. 11, the flash memory chip 1100 may include: DIE0and DIE1, where both DIE0 and DIE1 include two memory planes (such as Plane0 and Plane1); each Plane contains multiple memory blocks (such as Block0 to Block1023); each memory block includes multiple memory pages (such as Page0 to Page255). It should be noted that the structure in FIG. 11 is only an example illustration, and in actual use, the number of DIE, Plane, Block, and Page contained in the memory array may be designed according to actual conditions. In actual use, based on the flash memory chip shown in FIG. 11, in order to access these memory resources, the row address and column address are used, where the column address is the shift address within the Page. The definition of the row address may be shown in FIG. 12, that is the Logical Unit Number (LUN) address, Block address and Page address from the most significant bit (MSB) to the least significant bit (LSB), where the LUN address corresponds to accessing the corresponding DIE described above. The Block address is to access a memory block in a certain DIE, and its lowest bit is the Plane address, where the Plane address is to access a certain memory plane in a certain memory block. Page address is to access a certain memory page (i.e., Page) in a certain Block. For a multi-Plane (Multi-Plane) operation in the Open NAND Flash Interface (ONFI) protocol, the Page address of each Plane must be the same; for the Block address, memory arrays generated by different manufacturers correspond to different requirements, which will not be introduced one by one here. At this point, the program address information may be row address information, which includes a LUN address, a Block address, and a Page address.

Figure 13:
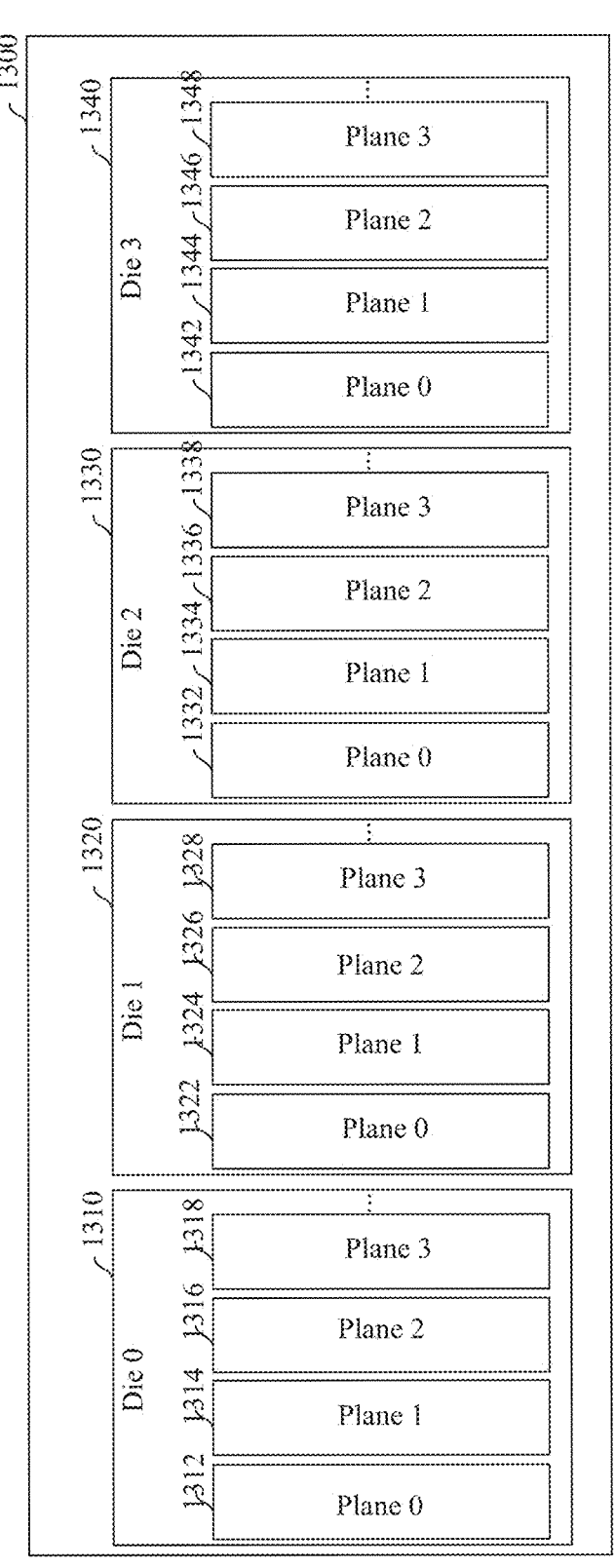
FIG. 13 is another structure schematic diagram of a memory device provided by an example of the present application.
Figure 14:
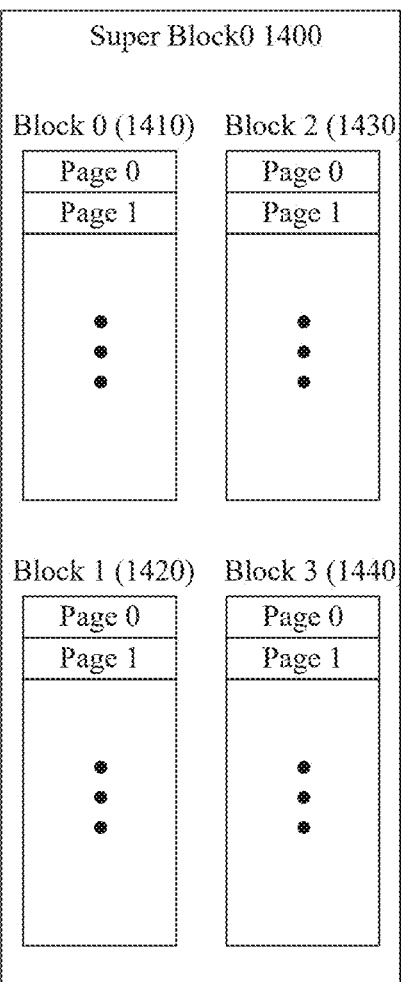
FIG. 14 is a structure schematic diagram of a super block provided by an example of the present application.

In some examples, the memory controller may store data in multiple blocks in a certain way, in other words, that is, the memory controller may write data to a Super block (SPB). Understanding of a super block is shown in FIG. 13, which shows an example block diagram of a memory device. Referring to FIG. 13, a memory device 1300 (which may be a NAND Flash) may include a plurality of memory dies, e.g., Die0-1310, Die1-1320, Die2-1330, and Die3-1340. Each Die from Die 0, Die 1, Die 2, and Die 3 may include multiple memory planes. That is, Die0-1310 may include memory plane 0 1312, memory plane 1 1314, memory plane 2 1316, and memory plane 3 1318. Die1-1320 may include memory plane 0 1322, memory plane 1 1324, memory plane 2 1326, and memory plane 3 1328. Die 2-1330 may include memory plane 0 1332, memory plane 1 1334, memory plane 2 1336, and memory plane 3 1338. Die3-1340 may include memory plane 0 1342, memory plane 1 1344, memory plane 2 1346, and memory plane 3 1348. Among them, each of the memory planes 1312, 1314, 1316, 1318, 1322, 1324, 1326, 1328, 1332, 1334, 1336, 1338, 1342, 1344, 1346 and 1348 included in Die 0, Die 1, Die 2, Die 3 may include multiple memory blocks. It should be noted that each Die shown in FIG. 13 includes 4 memory planes, which is only an example. In practice, each Die may also include other numbers of memory planes such as 6 memory planes, the present application does not limit the number of memory planes contained in one Die. Multiple memory blocks included in the memory device as shown in FIG. 13 may be divided to include a plurality of super blocks. Furthermore, in a write operation, data corresponding to a write command received from, e.g., a host may be written and stored into the super block through a one-shot procedure. The example structure of each super block is referred to FIG. 14, e.g., Super block 0 1400 may include the zero-th memory block (Block0) 1410 included in Die0-1310, the first memory block (Block1) 1420 included in Die1-1320, the second memory block (Block2) 1430 included in Die2-1330, and the third memory block (Block3) 1440 included in Die3-1340. Although FIG. 14 shows that super blocks 0-1400 include four memory blocks, the present application is not limited thereto.

Figure 15:
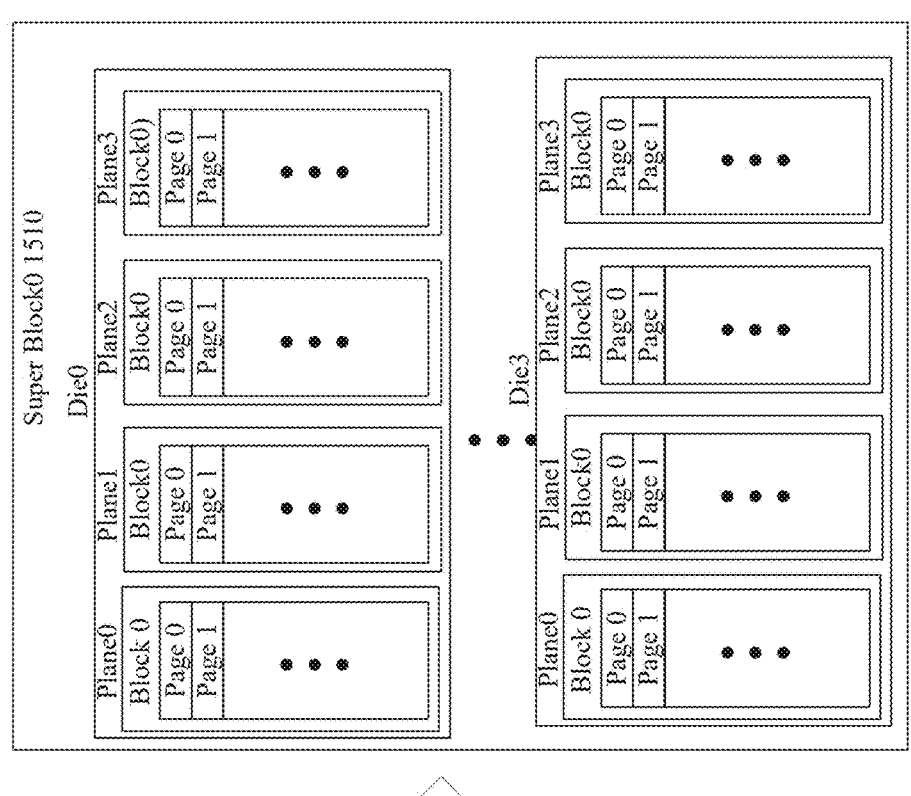
FIG. 15 is a structure schematic diagram of another super block provided by an example of the present application.
Figure 15:
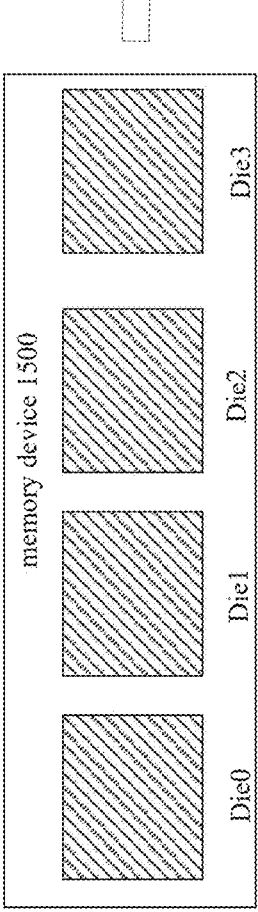

The way in which multiple memory blocks included in the memory device are divided into super blocks described above is only illustrated. There may also be different division methods according to different performance and user requirements of the memory device, e.g., the division of super blocks may also be according to extracting blocks with the same number from the Die included in the memory device to form a super block. For example, assume that the memory device 1500 includes 4 Dies (Die0, Die1, Die2, and Die3) as shown in FIG. 15, and each Die includes 4 memory planes (Plane0, Plane 1, Plane 2, Plane 3); each Plane includes multiple memory blocks (Block0, Block1, Block2, . . . , Block n), each Block includes multiple memory pages P (Page), in this structure, a super block is formed by extracting blocks with the same number from the Die included in the memory device, Super block 0 1510 as shown in FIG. 15 includes: Block 0 of each Plane in each Die of Die0, Die1, Die2 and Die3. The rest of the SPBs are deduced in sequence.

However, from the perspective of the memory controller, multiple Dies need to be concurrently configured for performance requirements, usually configured with multiple channels (CH). The number of Dies attached to a channel depends on the capacity and performance of the memory system, the greater the number of Dies is, the greater the number of concurrences is, and the better the performance is. Die is the smallest basic management unit for flash memory communication and is equipped with a set of buses described above, that is 8 I/O ports, 5 enable signals (ALE, CLE, WE #, RE #, CE #), and 1 status pin (R/B #), 1 write-protect pin (WP #), etc. If multiple flash memory Dies are attached to a channel, each Die shares a set of buses on each channel, that is, shares the CE #signal. Based on this, if the method of logically dividing super blocks is employed as an example to access the memory cells in these resources, it is required to know the super block (SPB) information, channel (CH) information, CE # information, LUN information, memory plane (PLN) information, memory block (Block) information, and memory page (Page) information. At this point, the so-called program address information is also a row address, which includes super block (SPB) address, channel (CH) address, CE #address, LUN address, memory plane (PLN) address, and memory block (Block) address, and Page address.

Here, the so-called global recording may refer that the memory controller has been performing this operation in the background, that is, it performs a check every first preset time duration, and then, when the different program locations are checked, it is updated into the first queue. Since the first queue is first in first out (FIFO), new program address information will be added to the tail of the first queue, and if the first queue is full, the element at the head will be deleted.

When it is required to read data, the memory controller receives a read command, and in response to the read command, determines the time period to which the time difference between the writing and reading of the data to be read belongs according to the program address information in the first queue and the read address information corresponding to the read command.

In some examples, the program address information in the first queue is divided according to the time period to form at least one first group of data; the memory controller may be further configured to: compare the read address information with the program address information in the first queue to determine the first group of data in which the read address information is located; determine the time period to which the time difference between the writing and reading of the data to be read belongs based on the first group of data in which the read address information is located.

It should be noted that, in fact, the time period reflecting the IVS degree may include multiple time periods. The program address information in the first queue is divided into at least one first group of data according to multiple time periods. Subsequently, the first group of data in which the read address information is located is determined, and then, the time period to which the time difference between the writing and reading of the data to be read belongs is determined according to the first group of data in which the read address information is located.

Figure 16:
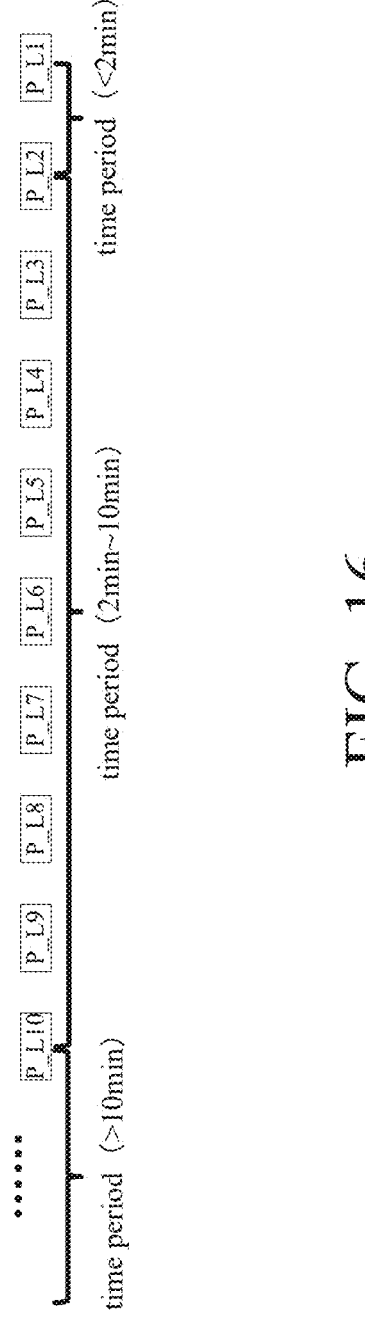
FIG. 16 is a schematic diagram of three first groups of data provided by an example of the present application.

For example, as shown in FIG. 10, the memory controller globally records and updates the latest M (10) program locations every 1 minute (min), and the corresponding program address information from far to near in time is P_L10, P_L9, . . . , P_L2, P_L1. There are three time periods, that is: <2 min; 2 min~10 min; >10 min, and the IVS degrees corresponding to the time periods described above gradually decrease. In this case, P_L10, P_L9, . . . . P_L2, P_L1 in the first queue are divided into three first groups of data, as shown in FIG. 16, which are respectively: the first group of data corresponding to the program address information after P_L2; the first group of data corresponding to the program address information between P_L2~P_L10; the first group of data corresponding to the program address information before P_L10. At this point, if the first group of data in which the read address information is located is the first group of data corresponding to the program address information after P_L2, the corresponding time period is a time period of <2 min, that is, the time difference between the writing and reading of data to be read is less than 2 min, it needs to pay attention to the IVS degree and the read voltage is adjusted. If the first group of data in which the read address information is located is the first group of data corresponding to the program address information between P_L2 and P_L10, the corresponding time period is a time period of 2 min~10 min, that is, the time difference between the writing and reading of data to be read is less than 2 min~10 min, it needs to pay attention to the IVS degree and the read voltage is adjusted, and the IVS degree is serious is the time period is <2 min, and the amplitude of the read voltage for adjustment is larger. If the first group of data in which the read address information is located is the first group of data corresponding to the program address information before P_L10, the corresponding time period is more than 10 min, that is, the time difference between the writing and reading of data to be read is more than 10 min, at this point, IVS has little impact on its threshold voltage and the read voltage may not be adjusted.

That is, in some examples, it is assumed that the time period reflecting the IVS degree include three time periods, that is: a first time period, a second time period and a third time period. The IVS degrees corresponding to the first time period, the second time period and the third time period increase in sequence. The memory controller is further configured to: in response to determining the time period to which the time difference between the writing and reading of the data to be read belongs to be the first time period, determine that the amount of the voltage shift is zero; in response to determining the time period to which the time difference between the writing and reading of the data to be read belongs to be the second time period, determine that the amount of the voltage shift to be a first shift value; in response to determining the time period to which the time difference between the writing and reading of the data to be read belongs to be the third time period, determine that the amount of the voltage shift to be a second shift value. The absolute value of the first shift is less than the absolute value of the second shift.

Here, the first shift and the second shift may be determined according to actual conditions.

It should be noted that the program address information in the first queue is divided according to the time period. Therefore, due to the number of time periods being different, the number of first groups of data into which the program address information in the first queue may be divided are also different. As another example, if the time period contains 4 time periods, that is <2 min; 2 min~5 min; 5 min~10 min; >10 min, then the program address information in the first queue will be divided into four first groups of data, respectively is: the first group of data corresponding to the program address information after P_L2; the first group of data corresponding to the program address information between P_L2~P_L5; the first group of data corresponding to the program address information between P_L5~P_L10; the first group of data corresponding to the program address information before P_L10. There are other division methods, which may be determined according to the actual situation.

In some examples, the memory controller may be further configured to: after the depth of the first queue reaches the first depth, and when a change of the program location in which the memory device is located is checked every the first preset time duration, delete the program address information corresponding to the head of the first queue, and insert new program address information into the tail of the first queue, to update the first queue and maintain the first queue at the first depth. The first depth is determined according to the first target time interval and the first preset time duration; the first target time interval is the boundary value between the first time period and the second time period which are adjacent, and in the first time period, the amount of the voltage shift is zero; and in the second time period, the amount of the voltage shift is not zero.

It should be noted that the elements that may be stored in the first queue are certain, e.g., M (10) in FIG. 10, that is, the first depth is equal to 10. What is described here is that after the first queue reaches the first depth, that is, after the queue is full, when a new program address information is checked, the first queue is updated in the form of FIFO, that is, when new program address information is inserted into the tail of the first queue, the program address information stored in its head is deleted. Furthermore, the first depth is determined according to the first time interval and the first preset time duration, which is obtained through dividing the first time interval by the first preset time, while the first time interval is the first time period and the second time period which are adjacent, and in the first time period, the amount of the voltage shift is zero; and in the second time period, the amount of the voltage shift is not zero.

In some examples, the first queue as shown in FIG. 10. The first time interval is 10 min, and the first preset time duration is 1 min. The first time period is 10 minutes before; and the second time period is 2 min~10 min. In the first time period, there is no need to pay attention to the impact of the IVS, and the voltage shift is 0; in the second time period, it is needed to pay attention to the impact of the IVS, and the amount of the voltage shift is not zero.

In some examples, the depth of the first queue reaches a first depth; the memory controller is further configured to: obtain, as the first program address information, the program address information corresponding to the last programming of the memory device when the read command is received; compare the first program address information with the program address information in the first queue; in response to the first program address information being the same as the program address information corresponding to the head of the first queue, determine the time period to which the time difference between the writing and reading of the data to be read belongs to be the first time period.

It should be noted that, after the first queue reaches the first depth and before the read address information is compared with the program address information in the first queue, it may be first determined whether there is a write operation within the first time interval (such as 10 minutes), if not, it means that the time difference between writing and reading of the data to be read is more than or equal to 10 min, and it may be directly determined that the time difference between the writing and reading of the data to be read belongs to the first time period, and there is no need to compare the read address information with the program address information in the first queue. That is, the first program address information corresponding to the last programming of the memory device when the read command is received is obtained, and then the first program address information is compared with the program address information in the first queue to determine whether it is required to compare the read address information with the program address information in the first queue. Moreover, when the first program address information is the same as the program address information for the head in the first queue, there is no need to compare the read address information with the program address information in the first queue. Thus, when the first program address information is different from the program address information corresponding to the head of the first queue, the subsequent execution operation may be skipped and the data to be read may be directly read according to the known read voltage (such as the default read voltage) to save read time.

In other examples, the program address information in the first queue is divided according to the time period to form at least one first group of data; the memory controller may be further configured to: in response to the first program address information being different from the program address information corresponding to the head of the first queue, compare the read address information with the program address information in the first queue; in response to the read address information being the same as the second program address information in the first queue, determine the first group of data in which the read address information is located, and determine the time period to which the time difference between the writing and reading of the data to be read belongs based on the first group of data in which the read address information is located.

That is, when the first program address information being different from the program address information corresponding to the head of the first queue, it is required to compare the read address information with the program address information in the first queue. Additionally, when the read address information is the same as the second program address information in the first queue, the first group of data in which the read address information is located is determined, and the time period to which the time difference between the writing and reading of the data to be read belongs is determined based on the first group of data in which the read address information is located. In some examples, the example of the determination method has been described previously, and will not be repeated here in order to save space. The second program address information may be any program address information in the first queue. Here, only the second program address information is used for unified description, and it is not limitation to the quantity.

In other examples, the memory controller may be further configured to: in response to the read address information being different from each program address information in the first queue, determine the time period to which the time difference between the writing and reading of the data to be read belongs to be the first time period. That is to say, the read address information corresponding to the data to be read is not in the first queue, then, it means that the time difference between writing and reading of the data to be read must be more than the first time interval (such as 10 min), therefore, the time difference between the writing and reading of the data to be read belongs to a time period that is less affected by the IVS effect, such as the first time period.

In some examples, the depth of the first queue does not reach the first depth; the program address information in the first queue is divided according to the time period to form at least one first group of data; the memory controller is further configured to: compare the read address information with the program address information in the first queue to determine the first group of data in which the read address information is located; and determine the time period to which the time difference between the writing and reading of the data to be read belongs based on the first group of data in which the read address information is located.

It should be noted that when the depth of the first queue does not reach the first depth, that is, the first queue is not full, and since the program address information in the first queue is the latest program location, at this point, the read address information corresponding to the read command must be the same as a certain program address information in the first queue, therefore, the first program address information may be compared with the program address information in the first queue without obtaining the first program address information, and the read address information may be directly compared with the program address information in the first queue, then, the first group of data in which the read address information is located is determined, and then the time period to which the time difference between writing and reading of the data to be read belongs is determined. The examples of the process have been described in detail before and will not be repeated here.

In some examples, the memory device includes a plurality of memory regions; each memory region includes a plurality of memory pages; the program address information is address information for a memory page into which data is written; the memory controller is further configured to: store the corresponding block information in the second queue according to the sequence in which data is written to the memory region; after the depth of the second queue reaches the second depth, in response to data being written into a new memory region, delete the block information for the memory region corresponding to the head of the second queue, and insert the block information for the new memory region into the tail of the second queue to update the second queue and maintain the second queue at the second depth; the second depth is greater than or equal to the first depth.

It should be noted that the so-called memory region may be the memory block or super block described above. That is, the corresponding block information is stored in the second queue according to the sequence in which data is written into the memory region, where the block information may include block address information for the memory region. For example, if the memory region is a memory block, the block information may be the number of the memory block, e.g., 0 in memory block 0. As another example, if the memory region is a super block, the block information may be the number of the super block, such as the aforementioned super block 0. Moreover, when the depth of the second queue reaches the second depth, according to the method for updating the FIFO, the block information for the new memory region is inserted into the tail and the block information at the head is deleted to maintain the depth of the second queue at the second depth. The second depth may be greater than or equal to the first depth. For example, the second depth may be 50, etc., which may be in some examples set according to the actual situation. It should be understood that when memory region starts to be written with data, its block information will be written in the second queue, and the latest program address information is stored in the first queue, therefore, the block information corresponding to the memory region in which the memory page corresponding to the program address information in the first queue is located should be stored in the second queue. In addition, it should be noted that the maintenance of the first queue and the second queue may both be background operations of the memory controller.

Figure 17:
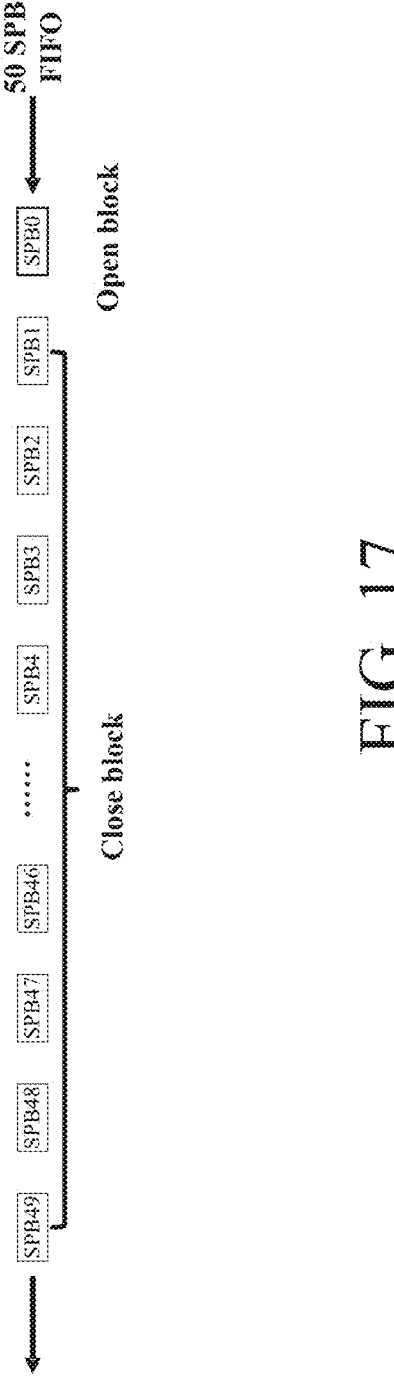
FIG. 17 is a structure schematic diagram of a second queue provided by an example of the present application.

In some examples, as shown in FIG. 17, the second queue contains 50 SPBs. They are divided into: SPB49, SPB48, SPB47, SPB46, . . . , SPB4, SPB3, SPB2, SPB1, SPB0 from far to near in the time sequence. Among them, SPB49, SPB48, SPB47, SPB46, . . . , SPB4, SPB3, SPB2, SPB1 are memory regions fully written with data, also referred to as Close block; SPB0 is a memory region not fully written with data, also referred to as Open block.

In some examples, the memory controller is further configured to: in response to the first program address information being different from the program address information corresponding to the head of the first queue, obtain the first block information for the memory region in which the data to be read is located; compare the first block information with the block information in the second queue; in response to the first block information being different from each of the block information in the second queue, determine that the time period to which the time difference between the writing and reading of the data to be read belongs to be the first time period.

That is, when the first queue is full and in the case that when the read command is received, the first program address information corresponding to the last programming of the memory device is different from the program address information at the head of the first queue, at this point, it is required to further determine the time period to which the time difference between writing and reading of the data to be read belongs according to the information carried by the read command (such as read address information). It should be understood that the writing scenarios of the memory device may include slow writing scenario and fast writing scenario. At this time, the program address information in the first queue may belong to the same memory region or may belong to different memory regions. If the time difference between writing and reading of the data stored in the entire memory region belongs to the first time period (such as the time period before 10 min), then if the data to be read is in the memory region, its read voltage may be directly compensated or adjusted, at this point, it is only required to parse the read command to obtain the block information for the memory region in which the data to be read is located, and the read address information corresponding to the memory page may be obtained without performing any deep analysis. Therefore, the way to obtain the time period to which the time difference between the writing and reading of the data to be read belongs may be simplified to: determine the first block information for the memory region in which the data to be read is located, compare the first block information with the block information in the second queue, and determine the time period to which the time difference between the writing and reading of the data to be read belongs according to the comparison result, for example, if the first block information differs from each of the block information in the second queue, the time period to which the time difference between the writing and reading of the data to be read belongs is directly determined to be the first time period.

In other examples, the second queue contains at least two pieces of block information; the memory controller may be further configured to: in response to the first block information being the same as a certain block information in the second queue, divide the block information in the second queue according to the program address information corresponding to the head of the first queue, the program address information corresponding to the tail, and the program address information for at least one designated location to form at least one second group of data; determine the second group of data to which the memory region in which the data to be read is located belongs; and determine the time period to which the time difference between the writing and reading of the data to be read belongs according to the second group of data to which the memory region in which the data to be read is located belongs.

It should be noted that when the first block information is the same as a certain block information in the second queue, the block information in the second queue may be divided first to form at least one second group of data; then, the second group of data in the memory region in which the first block information is located is determined, and then the time period to which the time difference between writing and reading of the data to be read belongs is determined.

Here, the block information in the second queue may be divided according to the program address information corresponding to the head of the first queue, the program address information corresponding to the tail, and the program address information for at least one designated location.

Figure 18:
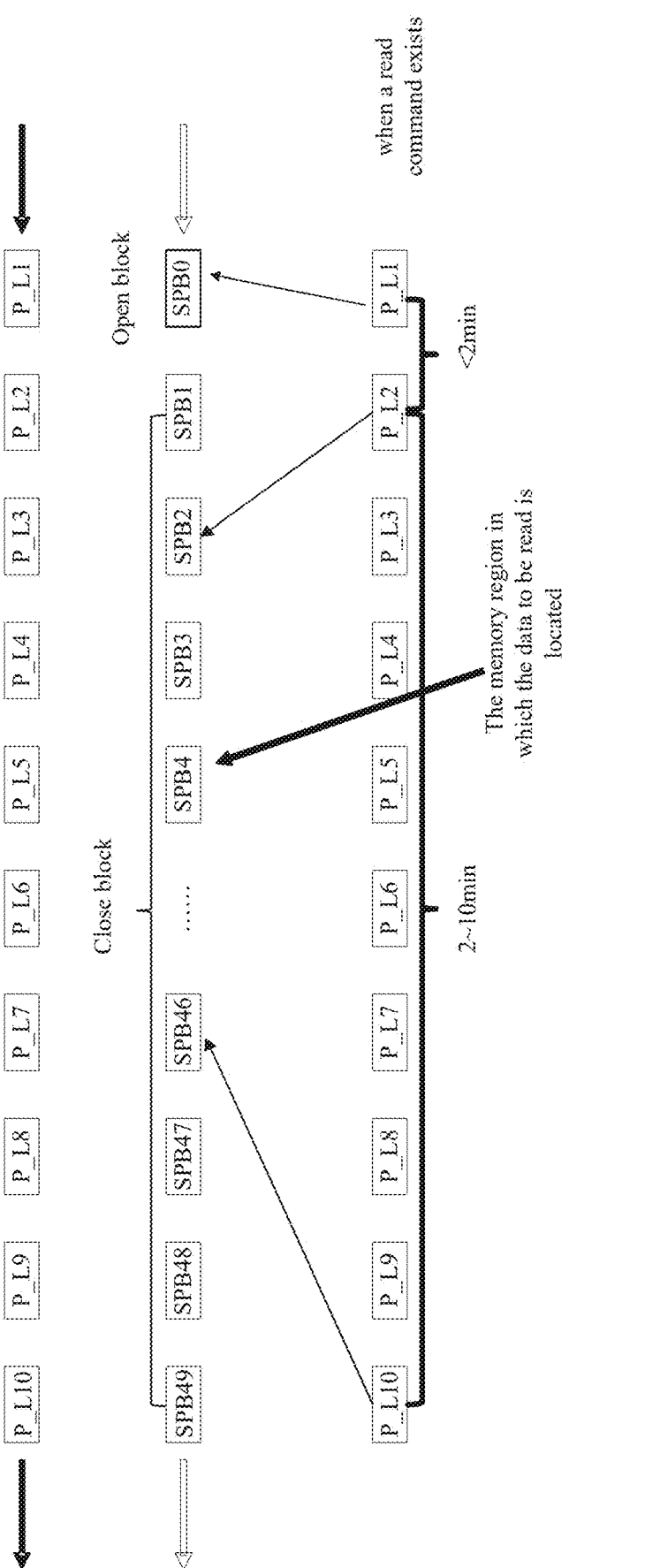
FIG. 18 is an example schematic diagram of division for a second queue provided by an example of the present application.

In some examples, the second queue as shown in FIG. 17 has a depth of 50 and a memory region is a super block. And the first queue as shown in FIG. 10 has a depth of 10. In this case, as shown in FIG. 18, the block information for the memory regions corresponding to P_L1, P_L2, and P_L10 is corresponded to the second queue, that is, the block information in the second queue may be divided into three second groups of data, respectively SPB0~SPB2; SPB2~SPB46; SPB46~SPB49. The second group of data in which the first block information is located is determined, e.g., in SPB2~SPB46, the corresponding time period is 2~10 min, i.e., the second time period, then the amount of the voltage shift is obtained.

In some examples, the at least one second group of data includes a first group and a second group. The first group corresponds to the first time period, and the second group corresponds to the second time period and the third time period, and the IVS degrees corresponding to the first time period, the second time period and the third time period increase in sequence; the memory controller is further configured to: in response to the second group of data to which the memory region in which the data to be read is located belongs being the first group, directly determine that the time period to which the time difference between the writing and reading of the data to be read belongs is the first time period; the first group includes respective memory regions between the memory region pointed to by the block information at the head of the second queue and the memory region pointed to by the block information in the second queue pointed to by the program address information at the head of the first queue.

That is, when the second data in the memory region in which the data to be read is located is the first group, the time period to which the time difference between the writing and reading of the data to be read belongs is directly determined to be the first time period. At this point, the first group includes respective memory regions between the memory region corresponding to the block information at the head of the second queue and the memory region pointed to by the block information in the second queue pointed to by the program address information at the head of the first queue. For example, the first group includes respective memory regions between SPB46 and SPB49 as shown in FIG. 18. That is, if the memory region in which the data to be read is located is between SPB46 and SPB49, the time period to which the time difference between the writing and reading of the data to be read belongs is directly determined to be the first time period.

In some examples, the memory controller is further configured to: in response to the second group of data to which the memory region in which the data to be read is located belongs being the second group, determine the time period to which the time difference between the writing and reading of the data to be read belongs according to the read address information and the program address information in the first queue; the second group includes respective memory regions corresponding to the second queue which are located in the second time period and the third time period; wherein, in response to determining the time period to which the time difference between the writing and reading of the data to be read belongs to be the second time period, determining the amount of the voltage shift to be a first shift value; in response to determining the time period to which the time difference between the writing and reading of the data to be read belongs to be the third time period, determining the amount of the voltage shift to be a second shift value; wherein, the absolute value of the first shift is less than the absolute value of the second shift.

Here, the memory region in which the data to be read is located belongs to the second group, then, it is required to in some examples determine the time period to which the time difference between the writing and reading of the data to be read belongs according to the read address information and the program address information in the first queue, where the determination operation have been described in detail previously and will not be repeated here. For example, as shown in FIG. 18, the second group includes memory regions between SPB4 and SPB46 in the second time period and memory regions between SPB0 and SPB4 in the third time period. If the first block information where the data to be read is located is in the second group, it is required to compare the read address information with the program address information in the first queue according to the previous comparison, and then determine the time period to which the time difference between the writing and reading of the data to be read belongs.

In order to understand the example 2, the provided solution described based on FIGS. 10 to 18 may be as follows:

Global Recording Operation:

Background operation by the memory controller: Update the most recently programmed M (10) program locations every 1 min, the recorded program address information is P_L10, P_L9, . . . . P_L2, P_L1 from far to near in time. The program address information needs to include SPB/CH/CE/

LUN/PLN/PAGE information. And the information is stored in the first queue in FIFO mode. The first queue may be stored in the memory of the memory controller. As shown in FIG. 10.

The Pperation for Write Path:

Each time an SPB is started for writing data, it is added to the second queue (newest block list), the block information in the newest block list retains the latest N (50) SPB information from far to near in the time sequence, as shown in FIG. 17.

The Operation for Read Path

When there is a Read Command:

Record the last program location at this time as the first program location information P_L0, and determine if P_L0 is equal to P_L10, that is, no data has been written in the last 10 minutes, then skip the following process, if P_L0 is not equal to P_L10, proceed to the following IVS degree determination:

Parse the read command, to obtain the read address information (including SPB/CH/CE/LUN/PLN/PAGE information), and determine whether it is in the following time period, if so, select the corresponding amount of the voltage shift, if not, select the default read voltage (default read level) or other read voltage.

The third time period: the range from P_L2 to P_L0 is <2 min (actually corresponding to the time difference between writing and reading (P2R)∈[0, 1] or [0, 2])

The second time period: the range from P_L10 to P_L2 is 2~10 min (actually corresponding to the time difference of P2R∈[1, 9] or [2, 10]).

The operation to determine the time period to which the time difference between the writing and reading of the data to be read belongs may be as follows: parse the 3 SPB information of P_L1/P_L2/P_L10, corresponding to the SPB location in the newest block list, 3 nodes may determine 2 SPB periods reflecting the IVS degree; determine whether the SPB information carried by the read command (that is, the first block information) is within the SPB period described above, if it is not, no special processing is required; if it is, determine whether the read address information corresponding to the data to be read is within the range of P_L10 to P_L0 according to the previous rules, if it is not, no special processing is required; if it is, determine the corresponding time period, and then determine the corresponding amount of the voltage shift.

In some examples, the memory device includes a plurality of memory regions; each memory region includes a plurality of memory pages; the program address information is address information for a memory page into which data is written; the memory controller may be further configured to: determine the time period to which the time difference between the writing and reading of the data to be read belongs according to the system time of the memory system, at least one of the first time or the second time; wherein, the first time is the recorded time at which the memory region in which the data to be read is located starts to be written with data; the second time is the recorded time at which the memory region in which the data to be read is located is fully written.

In some examples, the system time of the memory system may refer to the time that starts to be counted when the memory system starts running. The first time may refer to the time at which data starts to be written into the memory region in which the data to be read is located; the second time may refer to the time at which the memory region in which the data to be read is located is fully written. That is, the method of determining the time period to which the time difference between writing and reading of the data to be read belongs in example 3 may be to determine according to the system time, at least one of first time or second time.

In some examples, the memory controller may be further configured to: in response to the memory region in which the data to be read is located being a memory region fully written with data, determine the time period to which the time difference between the writing and reading of the data to be read belongs according to the time difference between the system time and the second time, and the time difference between the system time and the first time; in response to the memory region in which the data to be read is located being a memory region not fully written with data, determine the time period to which the time difference between the writing and reading of the data to be read belongs according to the time difference between the system time of the memory system and the first time.

That is to say, there are two situations: the first situation is: when the memory region in which the data to be read is located is a memory region fully written with data (i.e., Close Block), it is required to determine the time period to which the time difference between the writing and reading of the data to be read belongs according to the time difference between the system time and the second time, and the time difference between the system time and the first time. The second situation is: the memory region in which the data to be read is located is a memory region not fully written with data (i.e., Open Block), it is required to determine the time period to which the time difference between the writing and reading of the data to be read belongs according to the time difference between the system time of the memory system and the first time.

Figure 19:
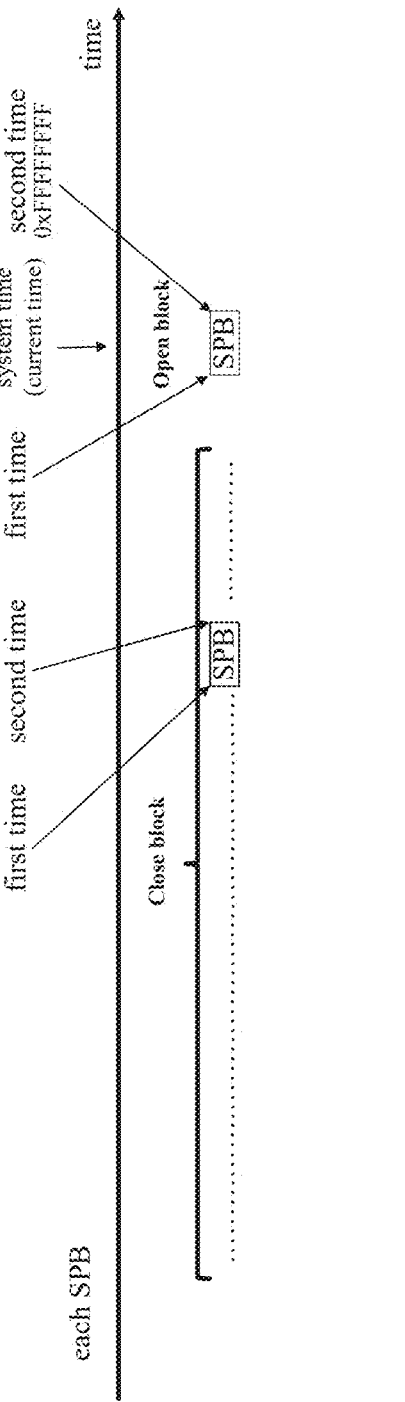
FIG. 19 is a schematic diagram for determining whether an SPB is a Close Block or an Open Block provided by an example of the present application.

The memory controller may determine whether the memory region belongs to a Close Block or an Open Block according to the system time, the first time and the second time. In some examples, as shown in FIG. 19, for each SPB, the initial values of the first time and the second time are 0xFFFFFFFF. If the first time of an SPB is set to be the initial value, it means that the SPB is a valid memory region; if the second time is set to be the initial value, it means that the SPB is an Open Block. Based on this, as shown in FIG. 19, for a certain SPB, if the system time (i.e., the current time) is less than its second time (at this point, the second time is the initial value 0xFFFFFFFF), the SPB is an Open Block; if the system time (i.e., the current time) is more than its second time (at this point, the second time is not the initial value 0xFFFFFFFF), the SPB is a Close Block.

Based on the above description, for determining the time period to which the time difference between the writing and reading of data to be read belongs, in some examples, if the time period reflecting the IVS degree include three time periods, that is: the first time period, the second time period and a third time period. The IVS degrees corresponding to the first time period, the second time period and the third time period increase in sequence; the memory region in which the data to be read is located is a memory region fully written with data; the memory controller may be further configured to: in response to the time difference between the system time and the second time belonging to the first time period, determine that the time period to which the time difference between the writing and reading of the data to be read belongs to be the first time period; in response to the time difference between the system time and the first time belonging to the third time period, determine that the time period to which the time difference between the writing and reading of the data to be read belongs to be the third time period; and in response to the time difference between the system time and the second time belonging to the second time period or the third time period, determine the time period to which the time difference between the writing and reading of the data to be read belongs according to the read address information, the first time, the system time and the first queue.

What is described above is that the memory region in which the data to be read is located is a fully written memory region, at this point, if the time difference between the system time and the second time belonging to the first time period, it is determined that the time period to which the time difference between the writing and reading of the data to be read belongs is also the first time period; if the time difference between the system time and the first time belonging to the third time period, it is determined that the time period to which the time difference between the writing and reading of the data to be read belongs is also the third time period. If the time difference between the system time and the second time belonging to the second time period or the third time period, it is then determined the time period to which the time difference between the writing and reading of the data to be read belongs according to the read address information, the first time, the system time and the first queue.

For the time difference between the system time and the second time belonging to the second time period or the third time period, in some examples, if the time difference between the system time and the second time belongs to the second time period, in this case, if the time difference between the first time and the system time belongs to the second time period, it is determined that the time period to which the time difference between the writing and reading of the data to be read belongs is the second time period. If the time difference between the first time and the system time belongs to the first time period, the read address information is compared with the program address information in the first queue, and if the read address information is different from the program address information in the first queue, it is determined that the time period to which the time difference between the writing and reading of the data to be read belongs is the first time period. If the read address information is the same as a program address information in the first queue, it is determined that the time period to which the time difference between the writing and reading of the data to be read belongs is the second time period.

In another case, if the time difference between the system time and the second time belongs to the third time period, and if the time difference between the first time and the system time belongs to the third time period, it is determined that the time period to which the time difference between the writing and reading of the data to be read belongs is the third time period. If the time difference between the first time and the system time belongs to the second time period, the read address information is compared with the program address information in the first queue to determine that the time period to which the time difference between the writing and reading of the data to be read belongs is the second time period or the third time period.

In some examples, the time period includes three time periods, respectively are: <2 min (i.e., the third time period); 2 min~10 min (i.e., the second time period); and more than 10 min (i.e., the first time period), at this point, if the time difference between the system time and the second time is more than 10 minutes, that is, it belongs to the first time period, then the time period to which the time difference between the writing and reading of the data to be read belongs also belongs to the first time period. If the time difference between the system time and the first time is less than 2 min, that is, belongs to the third time period, then the time period to which the time difference between the writing and reading of the data to be read belongs also belongs to the third time period. If the time difference between the system time and the second time belongs to the second time period or the third time period (that is, <2 min or 2 min~10 min), then according to the read address information, the program address information in the first queue, the first time and system time to determine, in some examples, if the time difference between the system time and the second time belongs to the second time period (2 min~10 min), in this case, if the time difference between the first time and the system time is in the second time period, it is determined that the time period to which the time difference between the writing and reading of the data to be read belongs is the second time period (2 min~10 min); if the time difference between the first time and the system time belongs to the first time period (more than 10 min), the read address information is compared with the program address information in the first queue, and if the read address information is different from the program address information in the first queue, it is determined that the time period to which the time difference between the writing and reading of the data to be read belongs is the first time period (more than 10 min); if the read address information is the same as a program address information in the first queue, it is determined that the time period to which the time difference between the writing and reading of the data to be read belongs is the second time period (2 min~10 min). Additionally, if the time difference between the system time and the second time belongs to the third time period (<2 min), then if the time difference between the first time and the system time belongs to the third time period, it is determined that the time period to which the time difference between the writing and reading of the data to be read belongs is the third time period (<2 min); if the time difference between the first time and the system time belongs to the second time period (2 min~10 min), the read address information is compared with the program address information in the first queue to determine that the time period to which the time difference between the writing and reading of the data to be read belongs is the second time period (2 min~10 min) or the third time period (<2 min).

When the memory region in which the data to be read is located is a memory region which is not fully written with data, the time period to which the time difference between the writing and reading of the data to be read belongs may be determined according to the time difference between the system time and the first time, in some examples, if the time difference between the first time and the system time belongs to the third time period, the time period to which the time difference between the writing and reading of the data to be read belongs is the third time period; and if the time difference between the first time and the system time belongs to the second time period or the first time period, it may be required to be determined according to comparing the read address information with the program address information in the first queue.

Example 4

In some examples, the memory device includes a plurality of memory regions; each memory region includes a plurality of memory pages; the program address information is address information for a memory page into which data is written; the memory controller may be further configured to:

determine the block information corresponding to the memory region in which each program address information in the first queue is located, and store each block information in a third queue according to the sequence in which the program address information is recorded in the first queue; the depth of the third queue is the same as the depth of the first queue; divide the block information in the third queue according to the time period to form at least one third group of data; in response to the memory region in which the data to be read is located being a memory region fully written with data, determine the third group of data to which the memory region in which the data to be read is located belongs according to the system time of the memory system and the first time or the second time, and determine the time period to which the time difference between the writing and reading of the data to be read belongs according to the third group of data to which the memory region in which the data to be read is located belongs. The first time is the recorded time at which the memory region in which the data to be read is located starts to be written with data; the second time is the recorded time at which the memory region in which the data to be read is located is fully written.

Figure 20:
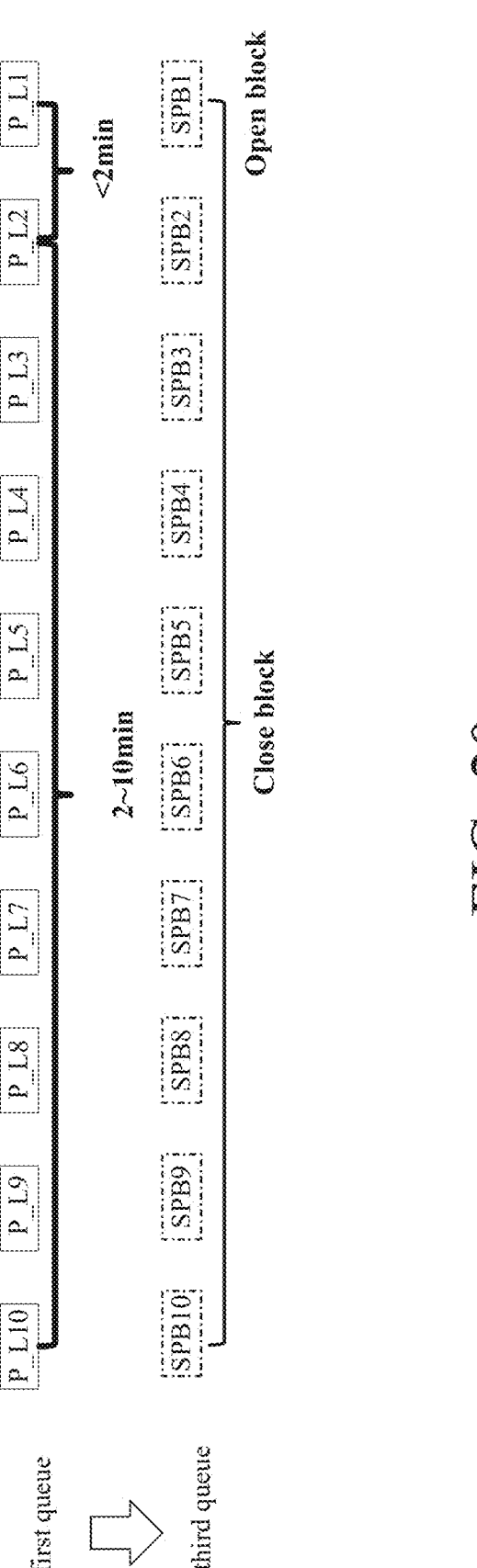
FIG. 20 is a structure schematic diagram of a third queue provided by an example of the present application.

In some examples, the first queue shown in FIG. 10 is converted into the third queue shown in FIG. 20. Among them, the memory region in which P_L1 is located is SPB1; the memory region in which P_L2 is located is SPB2; the memory region in which P_L3 is located is SPB3; the memory region in which P_L4 is located is SPB4; the memory region in which P_L5 is located is SPB5; the memory region in which P_L6 is located is SPB6; the memory region in which P_L7 is located is SPB7; the memory region in which P_L8 is located is SPB8; the memory region in which P_L9 is located is SPB9; the memory region in which P_L10 is located is SPB10.

For the third queue, it may also be divided according to the time period to form at least one third group of data. In some examples, as shown in FIG. 20, it contains three third groups of data, which are: the third group of data corresponding to the first time period (>10 min), including block information for the memory region SPB10; the third group of data corresponding to the second time period (2 min~10 min), including block information for each memory region between memory regions SPB2~SPB10; the third group of data corresponding to the third time period (<2 min), including block information for each memory region between memory regions SPB2~SPB1.

Then, when performing a read operation, if the memory region in which the data to be read is located is a memory region fully written with data, the time period to which the time difference between the writing and reading of the data to be read belongs is determined according to the system time, the first time and the second time of the memory region in which the data to be read is located. In some examples, if the time difference between the system time and the second time belongs to the first time period, that is, the memory region in which the data to be read is located is in the third group of data corresponding to the first time period, at this point, it is determined that the time difference between the writing and reading of the data in the entire memory region in which the data to be read is located belongs to the first time period, at this point, it is determined that the time period to which the time difference between the writing and reading of the data to be read belongs is also the first time period. The remaining situations may be understood according to the reasoning logic in the example 3 described above, which will not be repeated here in order to save space.

For the memory region in which the data to be read is located is a memory region which is not fully written with data, in some examples, the memory controller may be further configured to: in response to the memory region in which the data to be read is located being a memory region not fully written with data, determine the third group of data to which the memory region in which the data to be read is located belongs according to the system time of the memory system and the first time, and determine the time period to which the time difference between the writing and reading of the data to be read belongs according to the third group of data to which the memory region in which the data to be read is located belongs.

It is determined that the memory region in which the data to be read is located is in the third group of data according to the time difference between the system time and the first time, in some examples, if the time difference between the first time and the system time belongs to the third time period, then the memory region in which the data to be read is located is in the third time period and in the third group of data, it is further determined that the time period to which the time difference between the writing and reading of the data to be read belongs to be the third time period; and if the time difference between the first time and the system time belongs to the second time period or the first time period, it may be required to in some examples to determined according to comparing the read address information with the program address information in the first queue. The method for determining is described in detail before, which may be referred to for understanding, and will not be repeated here.

In order to understand the example, the examples of operations are as follows.

Global Recording Operation:

Memory controller background operation: Update the most recently programmed M (10) program locations every 1 min, the recorded program address information is P_L10, P_L9, . . . , P_L2, P_L1 from far to near in time. The program address information needs to include SPB/CH/CE/LUN/PLN/PAGE information. And the information is stored in the first queue in FIFO mode. The first queue may be stored in the memory of the memory controller. As shown in FIG. 10.

The Operation for Write Path:

Every time an SPB is started to write data, record absolute time information, the first time of starting (start time), the second time of being fully written with data (close time), moreover, the initial values of the first time and the second time are 0xFFFFFFFF. If the first time is set as the initial value, the SPB is valid and can be written with data; if the second time is set as the initial value, the SPB is an Open Block.

For Close/Open block determination: if the system time (Global time) is less than the second time (0xFFFFFFFF), the SPB is an Open Block; if the system time (Global time) is more than the second time (not 0xFFFFFFFF), the SPB is a Close Block.

Read Path, when There is a Read Command (Read Cmd):

1. Record the program address information for the program location at this time as the first program address information P_L0, determine whether P_L0 is equal to P_L10 (that is, no data has been written in the last 10 minutes), if so, skip the following process; if not, proceed to the following determination:

2. Convert the 10 first queues (PPA list) of P_L10~P_L1 into the third queue (Latest SPB list).

3. Parse read cmd to obtain SPB/CH/CE/LUN/PLN/ PAGE information. Determine whether the SPB of read is a Close Block or an Open Block;

If it is a Close Block, and if (global time-close time)>=10 min, SPB is in the first time period, and the default read voltage is used for reading.

If (global time—start time)<=2 min, the time difference between writing and reading data of all memory pages in the SPB is <2 min, it is required to determine the corresponding amount of the voltage shift to adjust the default read voltage.

If (global time—close time)<10 min & (global time-start time)>2 min, it is required to compare the read address information and the program address information in the first queue to perform a determination, details of which will not be described here.

If it is an Open Block, if (global time-start time)<=2 min, each of the time difference between writing and reading data of all memory pages in the SPB is <2 min, it is required to determine the corresponding amount of the voltage shift to adjust the default read voltage.

In other cases, it is required to compare the read address information program and the address information in the first queue to perform a determination, details of which will not be described here.

Example 5

In some examples, the memory controller may be further configured to: in response to the read command, determine the memory region in which the data to be read is located; obtain the time node information corresponding to the memory region in which the data to be read is located; and obtain the time period to which the time difference between the writing and reading of the data to be read belongs according to the time node information and the read address information corresponding to the read command; wherein, the time node information is to indicate the time period to which the time difference between the writing and reading of the data to be written into the memory region belongs.

Figure 21:
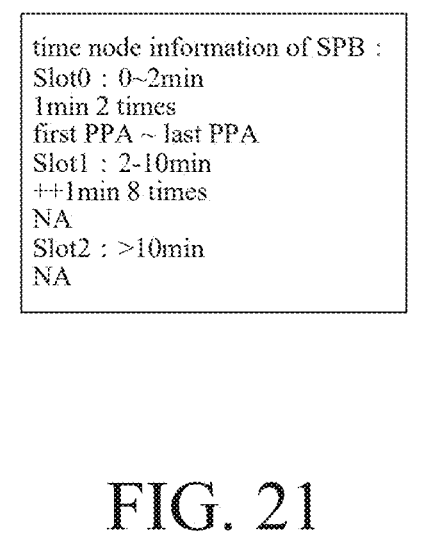

It should be noted that in this example, the time node information may be dynamically changing information, which is to display the time period to which the time difference between the writing and reading of respective data written in the memory region corresponding to a certain time belongs. In some examples, as shown in FIG. 21, wherein Slot0 is the third time period; Slot1 is the second time period; Slot2 is the first time period, and the SPB is a memory region fully written with data within 1 minute; NA indicates that there is no program address information in this time period; ++1 min 2 times indicates the number of 1 min required to move from Slot0 to Slot1. ++1 min 8 times indicates the number of 1 min required to move from Slot1 to Slot2.

Based on this time node information, when the read command comes, the time period in which the time difference between the writing and reading of the data to be read is located is determined with the time node information for the memory region in which the data to be read is located. Afterwards, a time period is determined to determine whether the read voltage for the read operation needs to be adjusted.

In order to obtain the time node information which is dynamically changed, in some examples, the memory controller may be further configured to: check the program location in which the memory device is located and the memory region in which the program location is located every second preset time duration, and store the program address information for different program locations into the time track slot according to the sequence for checking; and store the block information for different memory regions into the time track slot according to the sequence for checking; in response to the memory region starting to be written with data, inserting the block information for the memory region into the tail of the time track slot, and establishing the time node information for the memory region, the time period corresponding to the time difference between the writing and reading of the same data in the memory region corresponding to the time node information changes as the time track slot changes.

That is, in order to obtain the time node information, the memory controller may first maintain a time track slot containing M (n) arrays at the background, where the time interval between respective arrays in the time track slot is the second preset time duration. In some examples, the memory controller checks the program location in which the memory device is located and the memory region in which the program location is located every second preset time duration at the background globally, and records the program address information corresponding to the new program location and stores it in the time track slot, and record new block information (corresponding to the memory region in which data starts to be written) and store it in the time track slot.

Figure 22:
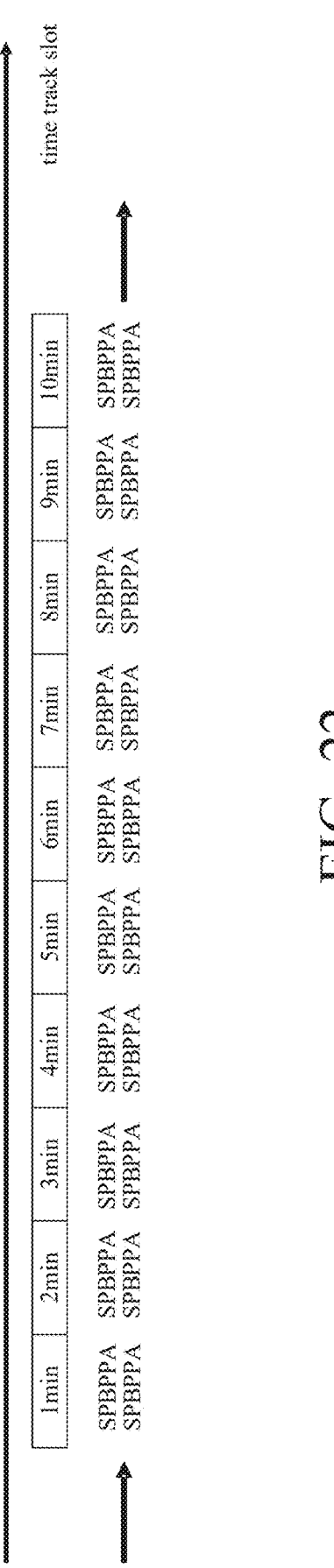
FIG. 22 is a structure schematic diagram of a time track slot provided by an example of the present application.

In some examples, the time track slot, as shown in FIG. 22, includes M (10) arrays, which record the block information (SPB) and program address information (PPA) of the memory region programmed in the last 10 minutes, and updates the time track slot every 1 min.

In some examples, the update of time node information may be as follows: every time a memory region is started to be written (e.g., open an SPB for writing data), the block information corresponding to this memory region is added to the element corresponding to 1 min in the time track slot, the time node information of the SPB moves every 1 min along with the global time track slot and determines whether to update; every time a piece of data is written, the delta time between the system time and the first time corresponding to the SPB, and whether the program address information corresponding to this piece of data is the program address information corresponding to the last programmable word line in SPB are checked, and when the program address information is the program address information corresponding to the last programmable word line in the SPB, flag0==TRUE is recorded. Each delta time is equal to Nmin, where N is a positive integer, N∈[1, 10], and the newest program address information is recorded as PPA_XN.

Figure 24:
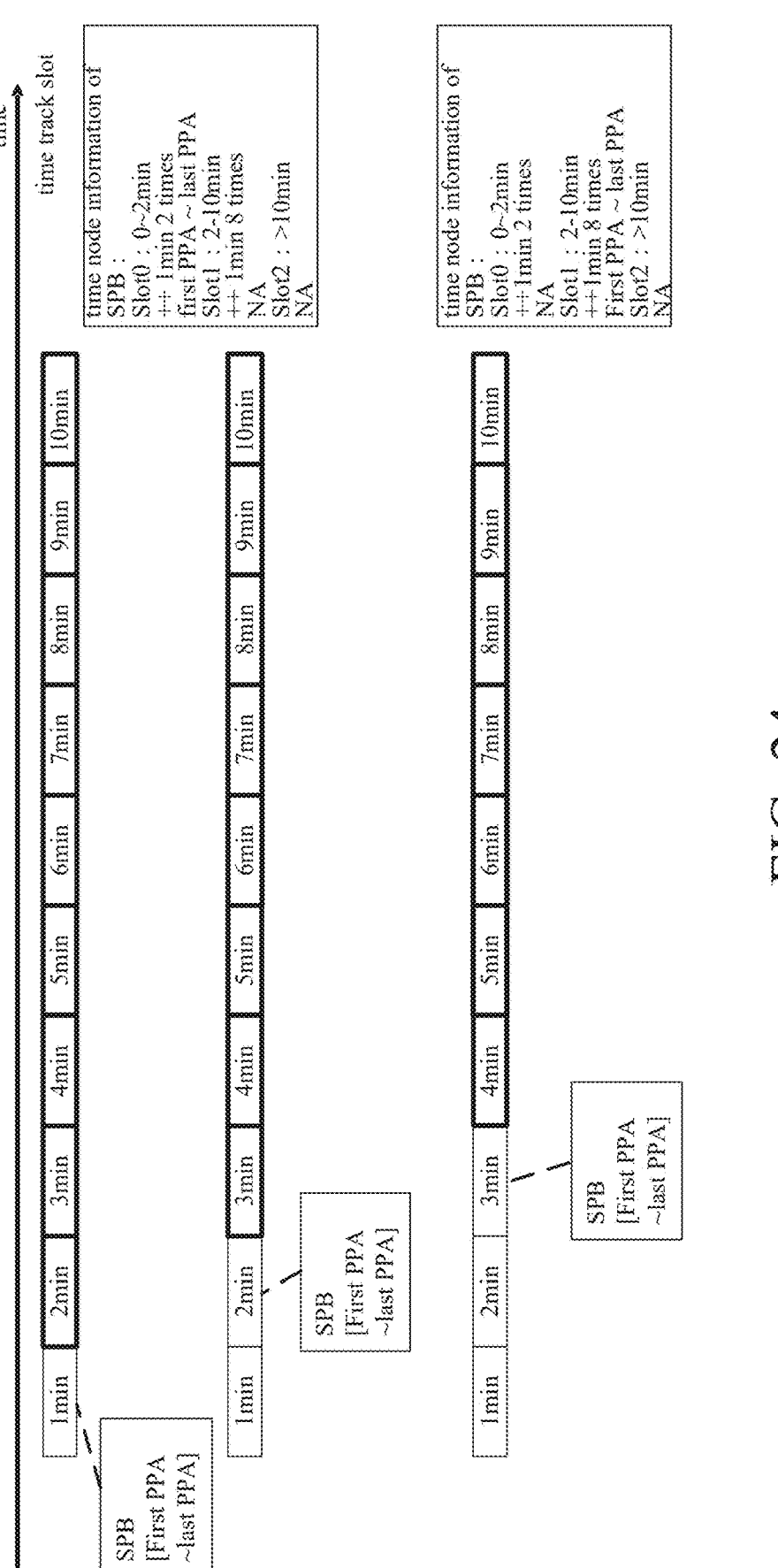
FIG. 24 is a structure schematic diagram of time node information changing with the time track in the time track slot provided by an example of the present application.

The change of time node information is as follows: when delta time<1 min& flag0==TRUE, it means that this SPB is fully written with data within 1 min, at this point, PPA Y (equal to last PPA) is recorded, and the SPB is shown in FIG. 23. As the time track slot moves two times (++1 min after 2 times), the time period to which the time difference between the writing and reading of data in the SPB belongs changes from time period slot0 to time period slot1, and as the time track slot moves another 8 times, time period slot1 changes to time period slot2, where time period slot1corresponds to the third time period described previously; time period slot1 corresponds to the second time period described previously; and time period slot2 corresponds to the first time period described previously. The above process is shown with reference to FIG. 24, as the time in the time track slot changes, the time period in which the program address information in the time node information is located changes.

Figure 25:
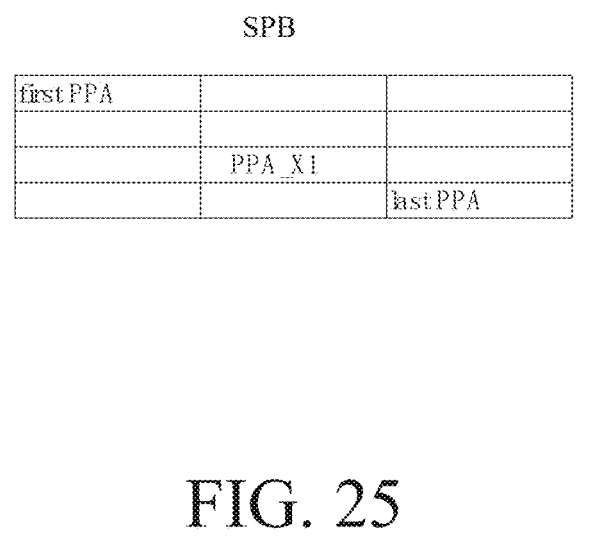

When delta time∈[1, 2 min] & flag0==TRUE, it means that the SPB is fully written with data within 1~2 min, at this point, it is recorded as PPA_X1 (when delta time==1 min), and PPA Y (equal to last PPA), which is divided into two sections: first PPA~PPA_X1 and PPA_X1~last PPA, this SPB is shown as in FIG. 25, as the time track slot moves two times (++1 min after 2 times), the time period to which the time difference between the writing and reading of data in the SPB belongs changes from time period slot0 to time period slot1, and as the time track slot moves another 8 times, slot1 changes to slot2.

When delta time ∈[2,3 min] & flag0==TRUE, it means that the SPB is fully written with data within 2~3 min, it is recorded as PPA_X1 (when delta time==1 min), PPA_X2 (when delta time==2 min) and PPA Y (equal to last PPA), which is divided into three sections: first PPA~PPA_X1, PPA_X1~PPA_X2 and PPA_X2~last PPA, this SPB is shown as in FIG. 26. As the time track slot moves two times (++1 min after 2 times), slot0 changes to slot1, and as the time track slot moves another 8 times, slot1 changes to slot2. and so on;

When delta time >10 min & flag0==TRUE, it means that the SPB is fully written with data more than 10 min, it is recorded as record PPA_X1/2/3 . . . /10 (when delta time==1/2/3 . . . /10 min) and PPA Y (equal to last PPA), which is divided into 11 periods: first PPA~PPA_X1, PPA_X1~PPA_X2, PPA_X2~PPA_X3, PPA_X10~last PPA, this SPB is shown as in FIG. 27. as the time track slot moves two times (++1 min after 2 times), slot0 changes to slot2, and as the time track slot moves another 8 times, slot1 changes to slot2. Based on this, the time node information corresponding to the memory region is updated to display the time period to which the time difference between the writing and reading of respective data in the memory region belongs.

For this time track slot, in some examples, the memory controller is further configured to: after the depth of the time track slot reaches a third depth, when at least one of a change of the program location or a change of the memory region in which the program location is located is checked every second preset time duration, delete at least one of the program address information or block information corresponding to the head in the time track slot, and insert at least one of new program address information or block information into the tail of the time track slot to update the time track slot and maintain the time track slot at the third depth; wherein, a third depth is determined according to a second target time interval and the second preset time duration; the second target time interval is the boundary value between the first time period and the second time period which are adjacent, and in the first time period, the amount of the voltage shift is zero; and in the second time period, the amount of the voltage shift is not zero.

It should be noted that the depth of this time track slot remains at the third depth. After reaching the third depth, if there is new program address information and new block information, the new program address information and new block information are stored in the time track slot in a FIFO manner. The third depth is determined in a similar manner to the first depth, which may be understood by reference here and will not be repeated here in order to save space.

What is described above is the maintenance of time track slots and time node information, which is performed during background operation or write operation of the memory controller. When reading data, in some examples, the memory controller may be further configured to: record the first time at which each memory region starts to be written with data and the second time at which each memory region is fully written with data; in response to the read command, obtain the first time for the memory region in which the data to be read is located; determine the type of the memory region in which the data to be read is located according to the system time of the memory system and the first time and the second time of the memory region in which the data to be read is located; in response to the memory region in which the data to be read is located being a memory region not fully written with data, obtain a first program address information corresponding to the last programming of the memory device when the read command is received; and update the first program address information to the third time period in the time node information for the memory region in which the data to be read is located.

It should be noted that the memory controller globally records the first time and second time of each memory region in the background, and when receiving the read command, obtains the first time for the memory region in which the data to be read is located, and determines the type of the memory region in which the data to be read is located according to the system time and the first time and the second time of the memory region in which the data to be read are located; this type includes a type that is fully written with data and a type that is not fully written with data. Moreover, when the type of the memory region in which the data to be read is located is a memory region that is not filled with data, the first program address information is updated to the third time period in its corresponding time node information, that is, updated to the time period that is most severely affected by IVS described above.

In some examples, the memory region includes multiple memory pages; the mapping relationship includes a first mapping relationship and a second mapping relationship; the memory controller is further configured to: in response to the memory region in which the data to be read is located being a memory region not fully written with data, obtain a first mapping relationship; determine, with the first mapping relationship, the amount of the voltage shift corresponding to the time period to which the time difference between the writing and reading of the data to be read belongs; different memory pages in the same time period in the first mapping relationship correspond to different amount of the voltage shifts; in response to the memory region in which the data to be read is located being a memory region fully written with data, obtain a second mapping relationship; determine, with the second mapping relationship, the amount of the voltage shift corresponding to the time period to which the time difference between the writing and reading of the data to be read belongs; different memory pages in the same time period in the second mapping relationship correspond to the same amount of the voltage shift.

It should be noted that two mapping relationships are described here: the first mapping relationship and the second mapping relationship, wherein the first mapping relationship is for a memory region that is not fully written with data, and the amount of the voltage shifts corresponding to different memory pages in the same time period are different, more in some examples, depending on whether the word line corresponding to the data to be read is at the edge (the last programmed word line in this memory region) or not at the edge (not the last programmed word line in this memory region), the amount of the voltage shift corresponding to these two cases are not the same. The second mapping relationship is for a memory region that is fully written with data, and the amount of the voltage shifts corresponding to different memory pages in the same time period is the same, that is, the amount of the voltage shifts corresponding to different word lines in the same memory region is the same.

In order to understand the example 5, the examples of operations may be as follows:

Global Update (Background Operation):

Update time track slot every period tA (1 min), the time track slot contains M (10) arrays, recording the last 10 min program. SPB/PAA information; SPB and SPB PAA information is attached to each array, FIFO every 1 min. As shown in FIG. 22.

The Operation for Write Path:

Every time an SPB is started to write data, record absolute time information, the first time of start (start time), the second time of being fully written with data (close time), moreover, the initial values of the first time and the second time are 0xFFFFFFFF, wherein, if the first time is set as the initial value, the SPB is valid and can be written with data; if the second time is set as the initial value, the SPB is an Open Block.

For Close/Open block determination: if the system time (Global time) is less than the second time (0xFFFFFFFF), the SPB is an Open Block; if the system time (Global time) is more than the second time (not 0xFFFFFFFF), the SPB is a Close Block.

Moreover, in the write path, the time node information changes with the time track slot, and description has been described in detail before with reference to FIGS. 23 to 27.

the operation for read path, when there is a read cmd:

1. Record the program location at this time, and its program address information is PAA_X0;

2. Parse the read cmd to obtain the SPB/CH/CE/LUN/PLN/PAGE information, obtain the first time according to the SPB information and determine whether the SPB is a Close Block or an Open Block according to the system time.

If it is a Close Block, select the corresponding slot according to the SPB information to obtain the corresponding time period, finally, obtain the corresponding amount of the voltage shift according to the first mapping relationship.

If it is an Open Block, update the end PAA of slot 0 to PAA_X0; select the appropriate slot according to the SPB to obtain the corresponding time period; and according to the page information, determine the corresponding amount of the voltage shift by using the second mapping relationship corresponding to the Open Block.

The memory system provided by an example of the present application determines in advance the physical location range of NAND affected by the IVS effect, when read address for a read operation falls within such range of locations, a matching amount of the voltage shift is selected to adjust and obtain a suitable read voltage to ensure one successful read. Read performance is improved by actively handling the IVS effect and adapting the read shift in advance. The PPA period of the corresponding IVS effect is accurately matched to ensure one read pass and meet high QoS requirements. Moreover, according to the inventive concept, for different actual scenarios (fast write scenario, slow write scenario, fast write+slow write scenario), several examples are provided for reference. In the actual application process, the computing power of the read and write paths needs to be balanced, therefore, in the examples described above, an implementation may be selected to use in a certain product according to the actual situation.

Figure 28:
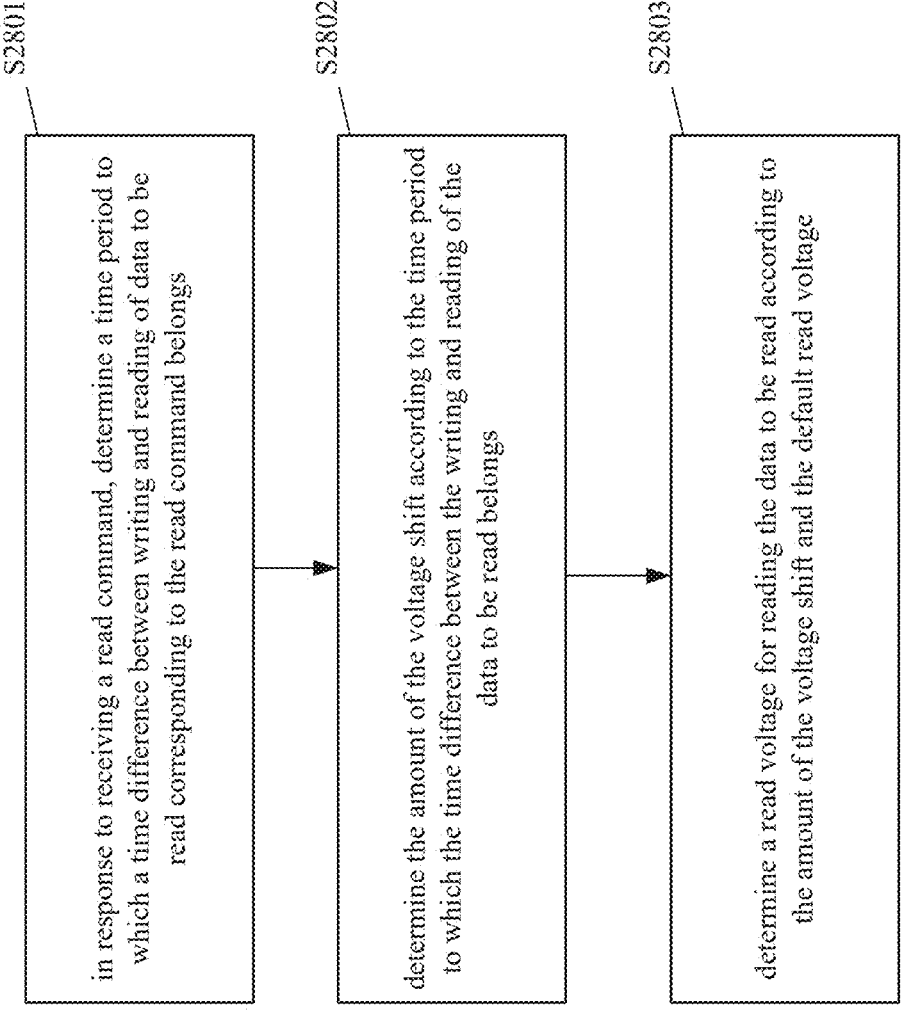
FIG. 28 is a schematic flowchart of a method for operating a memory system provided by an example of the present application.

Based on the inventive concept of the present application, an example of the present application also provides a method for operating a memory system, as shown in FIG. 28, which may include:

Operation 2801: in response to receiving a read command, determine a time period to which a time difference between writing and reading of data to be read corresponding to the read command belongs;

Operation 2802: determine the amount of the voltage shift according to the time period to which the time difference between the writing and reading of the data to be read belongs;

Operation 2803: determine a read voltage for reading the data to be read according to the amount of the voltage shift and the default read voltage.

In some examples, the time period is to reflect IVS degree of the initial threshold shift corresponding to the memory cell storing data in the memory device in the memory system; memory cells in different time periods correspond to different degrees of the IVS; the determining the amount of the voltage shift according to the time period to which the time difference between the writing and reading of the data to be read belongs includes: determine the amount of the voltage shift according to the time period to which the time difference between the writing and reading of the data to be read belongs and a mapping relationship; the mapping relationship includes multiple sub-mapping relationships, and each sub-mapping relationship includes a corresponded relationship between a time period and a corresponding amount of the voltage shift.

In some examples, the method further comprises: checking the program location in which the memory device is located every first preset time duration, and when different program locations are checked, storing the program address information for the different program locations in the first queue according to the sequence for checking; the determining a time period to which a time difference between writing and reading of data to be read corresponding to the read command belongs includes: determining the time period to which the time difference between the writing and reading of the data to be read belongs according to the program address information in the first queue and the read address information corresponding to the read command.

In some examples, the program address information in the first queue is divided according to the time period to form at least one first group of data; the determining the time period to which the time difference between the writing and reading of the data to be read belongs according to the program address information in the first queue and the read address information corresponding to the read command includes: comparing the read address information with the program address information in the first queue to determine the first group of data in which the read address information is located; determining the time period to which the time difference between the writing and reading of the data to be read belongs based on the first group of data in which the read address information is located.

In some examples, the method further comprises: after the depth of the first queue reaches the first depth, and when a change of the program location in which the memory device is located is checked every the first preset time duration, deleting the program address information corresponding to the head of the first queue, and inserting new program address information into the tail of the first queue, to update the first queue and maintain the first queue at the first depth; wherein, the first depth is determined according to the first target time interval and the first preset time duration; the first target time interval is the boundary value between the first time period and the second time period which are adjacent, and in the first time period, the amount of the voltage shift is zero; and in the second time period, the amount of the voltage shift is not zero.

In some examples, the depth of the first queue reaches a first depth; the method further comprises: obtaining, as the first program address information, the program address information corresponding to the last programming of the memory device when the read command is received; comparing the first program address information with the program address information in the first queue; in response to the first program address information being the same as the program address information corresponding to the head of the first queue, determining the time period to which the time difference between the writing and reading of the data to be read belongs to be the first time period.

In some examples, the program address information in the first queue is divided according to the time period to form at least one first group of data; the method further comprises: in response to the first program address information being different from the program address information corresponding to the head of the first queue, comparing the read address information with the program address information in the first queue; in response to the read address information being the same as the second program address information in the first queue, determining the first group of data in which the read address information is located, and determining the time period to which the time difference between the writing and reading of the data to be read belongs based on the first group of data in which the read address information is located.

In some examples, the method further comprises: in response to the read address information being different from each program address information in the first queue, determining the time period to which the time difference between the writing and reading of the data to be read belongs to be the first time period.

In some examples, the depth of the first queue does not reach first depth; the program address information in the first queue is divided according to the time period to form at least one first group of data; the method further comprises: comparing the read address information with the program address information in the first queue to determine the first group of data in which the read address information is located; and determining the time period to which the time difference between the writing and reading of the data to be read belongs based on the first group of data in which the read address information is located.

In some examples, the time period reflecting the IVS degree include three time periods, that is: a first time period, a second time period and a third time period, wherein, the IVS degrees corresponding to the first time period, the second time period and the third time period increase in sequence; the method further comprises: in response to determining the time period to which the time difference between the writing and reading of the data to be read belongs to be the first time period, determining that the amount of the voltage shift is zero; in response to determining the time period to which the time difference between the writing and reading of the data to be read belongs to be the second time period, determining the amount of the voltage shift to be a first shift value; in response to determining the time period to which the time difference between the writing and reading of the data to be read belongs to be the third time period, determining the amount of the voltage shift to be a second shift value; wherein, the absolute value of the first shift is less than the absolute value of the second shift.

In some examples, the memory device includes a plurality of memory regions; each memory region includes a plurality of memory pages; the program address information is address information for a memory page into which data is written; the method further comprises: storing the corresponding block information in the second queue according to the sequence in which data is written to the memory region; after the depth of the second queue reaches the second depth, in response to data being written into a new memory region, deleting the block information for the memory region corresponding to the head of the second queue, and inserting the block information for the new memory region into the tail of the second queue to update the second queue and maintaining the second queue at the second depth; the second depth is greater than or equal to the first depth.

In some examples, before comparing the read address information with the program address information in the first queue, the method further comprises: obtaining the first block information for the memory region in which the data to be read corresponding to the read command is located; comparing the first block information with the block information in the second queue; in response to the first block information being different from each of the block information in the second queue, determining the time period to which the time difference between the writing and reading of the data to be read belongs to be the first time period.

In some examples, the method further comprises: in response to the first block information being the same as a certain block information in the second queue, dividing the block information in the second queue according to the program address information corresponding to the head of the first queue, the program address information corresponding to the tail, and the program address information for at least one designated location to form at least one second group of data; determining the second group of data to which the memory region in which the data to be read is located belongs; and determining the time period to which the time difference between the writing and reading of the data to be read belongs according to the second group of data to which the memory region in which the data to be read is located belongs.

In some examples, the at least one second group of data includes a first group and a second group; wherein the first group corresponds to the first time period, and the second group corresponds to the second time period and the third time period, and the IVS degrees corresponding to the first time period, the second time period and the third time period increase in sequence; the method further comprises: in response to the second group of data to which the memory region in which the data to be read is located belongs being the first group, directly determining the time period to which the time difference between the writing and reading of the data to be read belongs is the first time period; the first group includes respective memory regions between the memory region pointed to by the block information at the head of the second queue and the memory region pointed to by the block information in the second queue pointed to by the program address information at the head of the first queue.

In some examples, the method further comprises: in response to the second group of data to which the memory region in which the data to be read is located belongs being the second group, determining the time period to which the time difference between the writing and reading of the data to be read belongs according to the read address information and the program address information in the first queue; the second group includes respective memory regions corresponding to the second queue which are located in the second time period and the third time period; wherein, in response to determining the time period to which the time difference between the writing and reading of the data to be read belongs to be the second time period, determining the amount of the voltage shift to be a first shift value; in response to determining the time period to which the time difference between the writing and reading of the data to be read belongs to be the third time period, determining the amount of the voltage shift to be a second shift value; wherein, the absolute value of the first shift is less than the absolute value of the second shift.

In some examples, the memory device includes a plurality of memory regions; each memory region includes a plurality of memory pages; the program address information is address information for a memory page into which data is written; the method further comprises: determining the time period to which the time difference between the writing and reading of the data to be read belongs according to the system time of the memory system, at least one of the first time or the second time; wherein, the first time is the recorded time at which the memory region in which the data to be read is located starts to be written with data; the second time is the recorded time at which the memory region in which the data to be read is located is fully written.

In some examples, the method further comprises: in response to the memory region in which the data to be read is located being a memory region fully written with data, determining the time period to which the time difference between the writing and reading of the data to be read belongs according to the time difference between the system time and the second time, and the time difference between the system time and the first time; in response to the memory region in which the data to be read is located being a memory region not fully written with data, determining the time period to which the time difference between the writing and reading of the data to be read belongs according to the time difference between the system time of the memory system and the first time.

In some examples, the time period reflecting the IVS degree include three time periods, that is: the first time period, the second time period and the third time period, wherein, the IVS degrees corresponding to the first time period, the second time period and the third time period increase in sequence; the method further comprises: in response to the time difference between the system time and the second time belonging to the first time period, determining the time period to which the time difference between the writing and reading of the data to be read belongs to be the first time period; in response to the time difference between the system time and the first time belonging to the third time period, determining the time period to which the time difference between the writing and reading of the data to be read belongs to be the third time period; in response to the time difference between the system time and the second time belonging to the second time period or the third time period, determining the time period to which the time difference between the writing and reading of the data to be read belongs according to the read address information, the first time, the system time and the first queue.

In some examples, the memory device includes a plurality of memory regions; each memory region includes a plurality of memory pages; the program address information is address information for a memory page into which data is written; the method further comprises: determining the block information corresponding to the memory region in which each program address information in the first queue is located, and storing each block information in a third queue according to the sequence in which the program address information is recorded in the first queue; the depth of the third queue is the same as the depth of the first queue; dividing the block information in the third queue according to the time period to form at least one third group of data; in response to the memory region in which the data to be read is located being a memory region fully written with data, determining the third group of data to which the memory region in which the data to be read is located belongs according to the system time of the memory system and the first time or the second time, and determining the time period to which the time difference between the writing and reading of the data to be read belongs according to the third group of data to which the memory region in which the data to be read is located belongs; wherein, the first time is the recorded time at which the memory region in which the data to be read is located starts to be written with data; the second time is the recorded time at which the memory region in which the data to be read is located is fully written.

In some examples, the method further comprises: in response to the memory region in which the data to be read is located being a memory region not fully written with data, determining the third group of data to which the memory region in which the data to be read is located belongs according to the system time of the memory system and the first time, and determining the time period to which the time difference between the writing and reading of the data to be read belongs according to the third group of data to which the memory region in which the data to be read is located belongs.

In some examples, the method further comprises: in response to the read command, determining the memory region in which the data to be read is located; obtaining the time node information corresponding to the memory region in which the data to be read is located; and obtaining the time period to which the time difference between the writing and reading of the data to be read belongs according to the time node information and the read address information corresponding to the read command; wherein, the time node information is to indicate the time period to which the time difference between the writing and reading of the data to be written into the memory region belongs.

In some examples, the method further comprises: checking the program location in which the memory device is located and the memory region in which the program location is located every second preset time duration, and storing the program address information for different program locations into the time track slot according to the sequence for checking; and storing the block information for different memory regions into the time track slot according to the sequence for checking; in response to the memory region starting to be written with data, inserting the block information for the memory region into the tail of the time track slot, and establishing the time node information for the memory region, the time period corresponding to the time difference between the writing and reading of the same data in the time node information changes with the time track in the time track slot.

In some examples, the method may further includes: after the depth of the time track slot reaches a third depth, when at least one of a change of the program location or a change of the memory region in which the program location is located is checked every second preset time duration, deleting at least one of the program address information or block information corresponding to the head in the time track slot, and inserting at least one of new program address information or block information into the tail of the time track slot to update the time track slot and maintain the time track slot at the third depth; wherein, a third depth is determined according to a second target time interval and the second preset time duration; the second target time interval is the boundary value between the first time period and the second time period which are adjacent, and in the first time period, the amount of the voltage shift is zero; and in the second time period, the amount of the voltage shift is not zero.

In some examples, the method further comprises: recording the first time at which each memory region starts to be written with data and the second time at which each memory region is fully written with data; in response to the read command, obtaining the first time for the memory region in which the data to be read is located; determining the type of the memory region in which the data to be read is located according to the system time of the memory system and the first time for the memory region in which the data to be read is located; in response to the memory region in which the data to be read is located being a memory region not fully written with data, obtaining a first program address information corresponding to the last programming of the memory device when the read command is received; and updating the first program address information to the third time period in the time node information for the memory region in which the data to be read is located.

It should be noted that the method for operating the memory system provided by the example of the present application is based on the operation of the aforementioned memory device, therefore, the two have the same technical features, and terms appearing in the method for operating the memory system are explained in detail in the memory system described above, and are also applicable here, thus will not be repeated here.

An example of the present disclosure further provides a readable storage medium, the readable storage medium stores computer program that when executed, may implement any one of the operating methods described above. The aforementioned storage media includes various media capable of storing program codes such as removable storage devices, Read-Only Memory (ROM), Random Access Memory (RAM), magnetic disk or optical disk, etc.

According to an example of the present application, a memory system is provided, including: a memory device and a memory controller coupled to the memory device; wherein, the memory controller is configured to: in response to a read command, determine a time period to which a time difference between writing and reading of data to be read corresponding to the read command belongs; determine amount of a voltage shift according to the time period to which the time difference between the writing and reading of the data to be read belongs; and determine a read voltage for reading the data to be read based on the amount of the voltage shift and the default read voltage.

In the scheme described above, the time period is to reflect a degree of the initial threshold shift IVS corresponding to the memory cell storing data in the memory device; the memory cells in different time periods correspond to different degrees of the IVS; the memory controller is further configured to: determine the amount of the voltage shift according to the time period to which the time difference between the writing and reading of the data to be read belongs and the mapping relationship; the mapping relationship includes multiple sub-mapping relationships, and each sub-mapping relationship includes a corresponded relationship between a time period and a corresponding amount of the voltage shift.

In the scheme described above, the memory controller is further configured to: check the program location at which the memory device is every a first preset time duration, and when different program locations are checked, store the program address information for the different program locations in the first queue according to the sequence for checking; in response to the read command, determine the time period to which the time difference between the writing and reading of the data to be read belongs according to the program address information in the first queue and the read address information corresponding to the read command.

In the scheme described above, the program address information in the first queue is divided according to the time period to form at least one first group of data; the memory controller is further configured to: compare the read address information with the program address information in the first queue to determine the first group of data in which the read address information is located; determine the time period to which the time difference between the writing and reading of the data to be read belongs based on the first group of data in which the read address information is located.

In the scheme described above, the memory controller is further configured to: after the depth of the first queue reaches the first depth, and when a change of the program location in which the memory device is located is checked every the first preset time duration, delete the program address information corresponding to the head of the first queue, and insert new program address information into the tail of the first queue, to update the first queue and maintain the first queue at the first depth; wherein, the first depth is determined according to the first target time interval and the first preset time duration; the first target time interval is the boundary value between the first time period and the second time period which are adjacent, and in the first time period, the amount of the voltage shift is zero; and in the second time period, the amount of the voltage shift is not zero.

In the scheme described above, the depth of the first queue reaches a first depth; the memory controller is further configured to: obtain, as the first program address information, the program address information corresponding to the last programming of the memory device when the read command is received; compare the first program address information with the program address information in the first queue; in response to the first program address information being the same as the program address information corresponding to the head of the first queue, determine the time period to which the time difference between the writing and reading of the data to be read belongs to be the first time period.

In the scheme described above, the program address information in the first queue is divided according to the time period to form at least one first group of data; the memory controller is further configured to: in response to the first program address information being different from the program address information corresponding to the head of the first queue, compare the read address information with the program address information in the first queue; in response to the read address information being the same as the second program address information in the first queue, determine the first group of data in which the read address information is located, and determine the time period to which the time difference between the writing and reading of the data to be read belongs based on the first group of data in which the read address information is located.

In the scheme described above, the memory controller is further configured to: in response to the read address information being different from each program address information in the first queue, determine the time period to which the time difference between the writing and reading of the data to be read belongs to be the first time period.

In the scheme described above, the depth of the first queue does not reach the first depth; the program address information in the first queue is divided according to the time period to form at least one first group of data; the memory controller is further configured to: compare the read address information with the program address information in the first queue to determine the first group of data in which the read address information is located; and determine the time period to which the time difference between the writing and reading of the data to be read belongs based on the first group of data in which the read address information is located.

In the scheme described above, the time period reflecting the IVS degree include three time periods, that is: a first time period, a second time period and a third time period, wherein, the IVS degrees corresponding to the first time period, the second time period and the third time period increase in sequence; the memory controller is further configured to: in response to determining the time period to which the time difference between the writing and reading of the data to be read belongs to be the first time period, determine that the amount of the voltage shift is zero; in response to determining the time period to which the time difference between the writing and reading of the data to be read belongs to be the second time period, determine that the amount of the voltage shift to be a first shift value; in response to determining the time period to which the time difference between the writing and reading of the data to be read belongs to be the third time period, determine that the amount of the voltage shift to be a second shift value; wherein, the absolute value of the first shift is less than the absolute value of the second shift.

In the scheme described above, the memory device includes a plurality of memory regions; each memory region includes a plurality of memory pages; the program address information is the address information for a memory page into which data is written; the memory controller is further configured to: store the corresponding block information in the second queue according to the sequence in which data is written to the memory region; after the depth of the second queue reaches the second depth, in response to data being written into a new memory region, delete the block information for the memory region corresponding to the head of the second queue, and insert the block information for the new memory region into the tail of the second queue to update the second queue and maintain the second queue at the second depth; the second depth is greater than or equal to the first depth.

In the scheme described above, the memory controller is further configured to: in response to the first program address information being different from the program address information corresponding to the head of the first queue, obtain the first block information for the memory region in which the data to be read is located; compare the first block information with the block information in the second queue; in response to the first block information being different from each of the block information in the second queue, determine that the time period to which the time difference between the writing and reading of the data to be read belongs to be the first time period.

In the scheme described above, the second queue contains at least two pieces of block information; the memory controller is further configured to: in response to the first block information being the same as a certain block information in the second queue, divide the block information in the second queue to form at least one second group of data according to the program address information corresponding to the head of the first queue, the program address information corresponding to the tail, and the program address information for at least one designated location; determine the second group of data to which the memory region in which the data to be read is located belongs; and determine the time period to which the time difference between the writing and reading of the data to be read belongs according to the second group of data to which the memory region in which the data to be read is located belongs.

In the scheme described above, the at least one second group of data includes a first group and a second group; wherein the first group corresponds to the first time period, and the second group corresponds to the second time period and the third time period, and the IVS degrees corresponding to the first time period, the second time period and the third time period increase in sequence; the memory controller is further configured to: in response to the second group of data to which the memory region in which the data to be read is located belongs being the first group, directly determine that the time period to which the time difference between the writing and reading of the data to be read belongs is the first time period; the first group includes respective memory regions between the memory region pointed to by the block information at the head of the second queue and the memory region pointed to by the block information in the second queue pointed to by the program address information at the head of the first queue.

In the scheme described above, the memory controller is further configured to: in response to the second group of data to which the memory region in which the data to be read is located belongs being the second group, determine the time period to which the time difference between the writing and reading of the data to be read belongs according to the read address information and the program address information in the first queue; the second group includes respective memory regions corresponding to the second queue which are located in the second time period and the third time period; wherein, in response to determining the time period to which the time difference between the writing and reading of the data to be read belongs to be the second time period, determine that the amount of the voltage shift to be a first shift value; in response to determining the time period to which the time difference between the writing and reading of the data to be read belongs to be the third time period, determine that the amount of the voltage shift to be a second shift value; wherein, the absolute value of the first shift is less than the absolute value of the second shift.

In the scheme described above, the block information includes block address information for a memory region.

In the scheme described above, the memory device includes a plurality of memory regions; each memory region includes a plurality of memory pages; the program address information is address information for a memory page into which data is written; the memory controller is further configured to: determine the time period to which the time difference between the writing and reading of the data to be read belongs according to the system time of the memory system, at least one of the first time or the second time; wherein, the first time is the recorded time at which the memory region in which the data to be read is located starts to be written with data; the second time is the recorded time at which the memory region in which the data to be read is located is fully written.

In the scheme described above, the memory controller is further configured to: in response to the memory region in which the data to be read is located being a memory region fully written with data, determine the time period to which the time difference between the writing and reading of the data to be read belongs according to the time difference between the system time and the second time, and the time difference between the system time and the first time; in response to the memory region in which the data to be read is located being a memory region not fully written with data, determine the time period to which the time difference between the writing and reading of the data to be read belongs according to the time difference between the system time of the memory system and the first time.

In the scheme described above, the time period reflecting the IVS degree include three time periods, that is: the first time period, the second time period and a third time period, wherein, the IVS degrees corresponding to the first time period, the second time period and the third time period increase in sequence; the memory region in which the data to be read is located is a memory region fully written with data; the memory controller is further configured to: in response to the time difference between the system time and the second time belonging to the first time period, determine that the time period to which the time difference between the writing and reading of the data to be read belongs to be the first time period; in response to the time difference between the system time and the first time belonging to the third time period, determine that the time period to which the time difference between the writing and reading of the data to be read belongs to be the third time period; in response to the time difference between the system time and the second time belonging to the second time period or the third time period, determine the time period to which the time difference between the writing and reading of the data to be read belongs according to the read address information, the first time, the system time and the first queue.

In the scheme described above, the memory device includes a plurality of memory regions; each memory region includes a plurality of memory pages; the program address information is address information for a memory page into which data is written; the memory controller is further configured to: determine the block information corresponding to the memory region in which each program address information in the first queue is located, and store each block information in a third queue according to the sequence in which the program address information is recorded in the first queue; the depth of the third queue is the same as the depth of the first queue; divide the block information in the third queue according to the time period to form at least one third group of data; in response to the memory region in which the data to be read is located being a memory region fully written with data, determine the third group of data to which the memory region in which the data to be read is located belongs according to the system time of the memory system and the first time or the second time, and determine the time period to which the time difference between the writing and reading of the data to be read belongs according to the third group of data to which the memory region in which the data to be read is located belongs; wherein, the first time is the recorded time at which the memory region in which the data to be read is located starts to be written with data; the second time is the recorded time at which the memory region in which the data to be read is located is fully written.

In the scheme described above, the memory controller is further configured to: in response to the memory region in which the data to be read is located being a memory region not fully written with data, determine the third group of data to which the memory region in which the data to be read is located belongs according to the system time of the memory system and the first time, and determine the time period to which the time difference between the writing and reading of the data to be read belongs according to the third group of data to which the memory region in which the data to be read is located belongs.

In the scheme described above, the memory controller is further configured to: in response to the read command, determine the memory region in which the data to be read is located; obtain the time node information corresponding to the memory region in which the data to be read is located; and obtain the time period to which the time difference between the writing and reading of the data to be read belongs according to the time node information and the read address information corresponding to the read command; wherein, the time node information is to indicate the time period to which the time difference between the writing and reading of the data to be written into the memory region belongs.

In the scheme described above, the memory controller is further configured to: check the program location in which the memory device is located and the memory region in which the program location is located every second preset time duration, and store the program address information for different program locations into the time track slot according to the sequence for checking; and store the block information for different memory regions into the time track slot according to the sequence for checking; in response to the memory region starting to be written with data, insert the block information for the memory region into the tail of the time track slot, and establish the time node information for the memory region, the time period corresponding to the time difference between the writing and reading of the same data in the time node information changes with the time track in the time track slot.

In the scheme described above, the memory controller is further configured to: after the depth of the time track slot reaches a third depth, when at least one of a change of the program location or a change of the memory region in which the program location is located changes is checked every second preset time duration, delete at least one of the program address information or block information corresponding to the head in the time track slot, and insert at least one of new program address information or block information into the tail of the time track slot to update the time track slot and maintain the time track slot at the third depth;

wherein, a third depth is determined according to a second target time interval and the second preset time duration; the second target time interval is the boundary value between the first time period and the second time period which are adjacent, and in the first time period, the amount of the voltage shift is zero; and in the second time period, the amount of the voltage shift is not zero.

In the scheme described above, the memory controller is further configured to: record the first time at which each memory region starts to be written with data and the second time at which each memory region is fully written with data; in response to the read command, obtain the first time for the memory region in which the data to be read is located; determine the type of the memory region in which the data to be read is located according to the system time of the memory system and the first time for the memory region in which the data to be read is located; in response to the memory region in which the data to be read is located being a memory region not fully written with data, obtain a first program address information corresponding to the last programming of the memory device when the read command is received; and update the first program address information to the third time period into the time node information for the memory region in which the data to be read is located.

In the scheme described above, the memory region includes multiple memory pages; the mapping relationship includes a first mapping relationship and a second mapping relationship; the memory controller is further configured to: in response to the memory region in which the data to be read is located being a memory region not fully written with data, obtain a first mapping relationship; determine, with the first mapping relationship, the amount of the voltage shift corresponding to the time period to which the time difference between the writing and reading of the data to be read belongs; different memory pages in the same time period in the first mapping relationship correspond to different amount of the voltage shifts; in response to the memory region in which the data to be read is located being a memory region fully written with data, obtain a second mapping relationship; determine, with the second mapping relationship, the amount of the voltage shift corresponding to the time period to which the time difference between the writing and reading of the data to be read belongs; different memory pages in the same time period in the second mapping relationship correspond to the same amount of the voltage shift.

According to an example of the present application, a method for operating a memory system is provided, including: in response to receiving a read command, determining a time period to which a time difference between writing and reading of data to be read corresponding to the read command belongs; determining the amount of the voltage shift according to the time period to which the time difference between the writing and reading of the data to be read belongs; determining a read voltage for reading the data to be read according to the amount of the voltage shift and the default read voltage.

In the scheme described above, the time period is to reflect a degree of the initial threshold shift IVS corresponding to the memory cell storing data in the memory device in the memory system; memory cells in different time periods correspond to different degrees of the IVS; the determining the amount of the voltage shift according to the time period to which the time difference between the writing and reading of the data to be read belongs includes: determining the amount of the voltage shift according to the time period to which the time difference between the writing and reading of the data to be read belongs and a mapping relationship; the mapping relationship includes multiple sub-mapping relationships, and each sub-mapping relationship includes a corresponded relationship between a time period and a corresponding amount of the voltage shift.

In the scheme described above, the method further comprises: checking the program location in which the memory device is located every first preset time duration, and when different program locations are checked, storing the program address information for the different program locations in the first queue according to the sequence for checking; the determining a time period to which a time difference between writing and reading of data to be read corresponding to the read command belongs includes: determining the time period to which the time difference between the writing and reading of the data to be read belongs according to the program address information in the first queue and the read address information corresponding to the read command.

In the scheme described above, the program address information in the first queue is divided according to the time period to form at least one first group of data; the determining the time period to which the time difference between the writing and reading of the data to be read belongs according to the program address information in the first queue and the read address information corresponding to the read command includes: comparing the read address information with the program address information in the first queue to determine the first group of data in which the read address information is located; determining the time period to which the time difference between the writing and reading of the data to be read belongs based on the first group of data in which the read address information is located.

In the scheme described above, the method further comprises: after the depth of the first queue reaches the first depth, and when a change of the program location in which the memory device is located is checked every the first preset time duration, deleting the program address information corresponding to the head of the first queue, and inserting new program address information into the tail of the first queue, to update the first queue and maintain the first queue at the first depth; wherein, the first depth is determined according to the first target time interval and the first preset time duration; the first target time interval is the boundary value between the first time period and the second time period which are adjacent, and in the first time period, the amount of the voltage shift is zero; and in the second time period, the amount of the voltage shift is not zero.

In the scheme described above, the depth of the first queue reaches a first depth; the method further comprises: obtaining, as the first program address information, the program address information corresponding to the last programming of the memory device when the read command is received; comparing the first program address information with the program address information in the first queue; in response to the first program address information being the same as the program address information corresponding to the head of the first queue, determining the time period to which the time difference between the writing and reading of the data to be read belongs to be the first time period.

In the scheme described above, the program address information in the first queue is divided according to the time period to form at least one first group of data; the method further comprises: in response to the first program address information being different from the program address information corresponding to the head of the first queue, comparing the read address information with the program address information in the first queue; in response to the read address information being the same as the second program address information in the first queue, determining the first group of data in which the read address information is located, and determining the time period to which the time difference between the writing and reading of the data to be read belongs based on the first group of data in which the read address information is located.

In the scheme described above, the method further comprises: in response to the read address information being different from each program address information in the first queue, determining the time period to which the time difference between the writing and reading of the data to be read belongs to be the first time period.

In the scheme described above, the depth of the first queue does not reach first depth; the program address information in the first queue is divided according to the time period to form at least one first group of data; the method further comprises: comparing the read address information with the program address information in the first queue to determine the first group of data in which the read address information is located; and determining the time period to which the time difference between the writing and reading of the data to be read belongs based on the first group of data in which the read address information is located.

In the scheme described above, the time period reflecting the IVS degree include three time periods, that is: a first time period, a second time period and a third time period, wherein, the IVS degrees corresponding to the first time period, the second time period and the third time period increase in sequence; the method further comprises: in response to determining the time period to which the time difference between the writing and reading of the data to be read belongs to be the first time period, determining that the amount of the voltage shift is zero; in response to determining the time period to which the time difference between the writing and reading of the data to be read belongs to be the second time period, determining the amount of the voltage shift to be a first shift value; in response to determining the time period to which the time difference between the writing and reading of the data to be read belongs to be the third time period, determining the amount of the voltage shift to be a second shift value; wherein, the absolute value of the first shift is less than the absolute value of the second shift.

In the scheme described above, the memory device includes a plurality of memory regions; each memory region includes a plurality of memory pages; the program address information is address information for a memory page into which data is written; the method further comprises: storing the corresponding block information in the second queue according to the sequence in which data is written to the memory region; after the depth of the second queue reaches the second depth, in response to data being written into a new memory region, deleting the block information for the memory region corresponding to the head of the second queue, and inserting the block information for the new memory region into the tail of the second queue to update the second queue and maintain the second queue at the second depth; the second depth is greater than or equal to the first depth.

In the scheme described above, before comparing the read address information with the program address information in the first queue, the method further comprises: obtaining the first block information for the memory region in which the data to be read corresponding to the read command is located; comparing the first block information with the block information in the second queue; in response to the first block information being different from each of the block information in the second queue, determining the time period to which the time difference between the writing and reading of the data to be read belongs to be the first time period.

In the scheme described above, the method further comprises: in response to the first block information being the same as a certain block information in the second queue, dividing the block information in the second queue to form at least one second group of data according to the program address information corresponding to the head of the first queue, the program address information corresponding to the tail, and the program address information for at least one designated location; determining the second group of data to which the memory region in which the data to be read is located belongs; and determining the time period to which the time difference between the writing and reading of the data to be read belongs according to the second group of data to which the memory region in which the data to be read is located belongs.

In the scheme described above, the at least one second group of data includes a first group and a second group; wherein the first group corresponds to the first time period, and the second group corresponds to the second time period and the third time period, and the IVS degrees corresponding to the first time period, the second time period and the third time period increase in sequence; the method further comprises: in response to the second group of data to which the memory region in which the data to be read is located belongs being the first group, directly determine that the time period to which the time difference between the writing and reading of the data to be read belongs is the first time period; the first group includes respective memory regions between the memory region pointed to by the block information at the head of the second queue and the memory region pointed to by the block information in the second queue pointed to by the program address information at the head of the first queue.

In the scheme described above, the method further comprises: in response to the second group of data to which the memory region in which the data to be read is located belongs being the second group, determining the time period to which the time difference between the writing and reading of the data to be read belongs according to the read address information and the program address information in the first queue; the second group includes respective memory regions corresponding to the second queue which are located in the second time period and the third time period; wherein, in response to determining the time period to which the time difference between the writing and reading of the data to be read belongs to be the second time period, determining the amount of the voltage shift to be a first shift value; in response to determining the time period to which the time difference between the writing and reading of the data to be read belongs to be the third time period, determining the amount of the voltage shift to be a second shift value; wherein, the absolute value of the first shift is less than the absolute value of the second shift.

In the scheme described above, the memory device includes a plurality of memory regions; each memory region includes a plurality of memory pages; the program address information is address information for a memory page into which data is written; the method further comprises: determining the time period to which the time difference between the writing and reading of the data to be read belongs according to the system time of the memory system, at least one of the first time or the second time; wherein, the first time is the recorded time at which the memory region in which the data to be read is located starts to be written with data; the second time is the recorded time at which the memory region in which the data to be read is located is fully written.

In the scheme described above, the method further comprises: in response to the memory region in which the data to be read is located being a memory region fully written with data, determining the time period to which the time difference between the writing and reading of the data to be read belongs according to the time difference between the system time and the second time, and the time difference between the system time and the first time; in response to the memory region in which the data to be read is located being a memory region not fully written with data, determining the time period to which the time difference between the writing and reading of the data to be read belongs according to the time difference between the system time of the memory system and the first time.

In the scheme described above, the time period reflecting the IVS degree include three time periods, that is: the first time period, the second time period and the third time period, wherein, the IVS degrees corresponding to the first time period, the second time period and the third time period increase in sequence; the method further comprises: in response to the time difference between the system time and the second time belonging to the first time period, determining the time period to which the time difference between the writing and reading of the data to be read belongs to be the first time period; in response to the time difference between the system time and the first time belonging to the third time period, determining the time period to which the time difference between the writing and reading of the data to be read belongs to be the third time period; in response to the time difference between the system time and the second time belonging to the second time period or the third time period, determining the time period to which the time difference between the writing and reading of the data to be read belongs according to the read address information, the first time, the system time and the first queue.

In the scheme described above, the memory device includes a plurality of memory regions; each memory region includes a plurality of memory pages; the program address information is address information for a memory page into which data is written; the method further comprises: determining the block information corresponding to the memory region in which each program address information in the first queue is located, and storing each block information in a third queue according to the sequence in which the program address information is recorded in the first queue; the depth of the third queue is the same as the depth of the first queue; dividing the block information in the third queue according to the time period to form at least one third group of data; in response to the memory region in which the data to be read is located being a memory region fully written with data, determining the third group of data to which the memory region in which the data to be read is located belongs according to the system time of the memory system and the first time or the second time, and determining the time period to which the time difference between the writing and reading of the data to be read belongs according to the third group of data to which the memory region in which the data to be read is located belongs; wherein, the first time is the recorded time at which the memory region in which the data to be read is located starts to be written with data; the second time is the recorded time at which the memory region in which the data to be read is located is fully written.

In the scheme described above, the method further comprises: in response to the memory region in which the data to be read is located being a memory region not fully written with data, determining the third group of data to which the memory region in which the data to be read is located belongs according to the system time of the memory system and the first time, and determining the time period to which the time difference between the writing and reading of the data to be read belongs according to the third group of data to which the memory region in which the data to be read is located belongs.

In the scheme described above, the method further comprises: in response to the read command, determining the memory region in which the data to be read is located; obtaining the time node information corresponding to the memory region in which the data to be read is located; and obtaining the time period to which the time difference between the writing and reading of the data to be read belongs according to the time node information and the read address information corresponding to the read command; wherein, the time node information is to indicate the time period to which the time difference between the writing and reading of the data to be written into the memory region belongs.

In the scheme described above, the method further comprises: checking the program location in which the memory device is located and the memory region in which the program location is located every second preset time duration, and storing the program address information for different program locations into the time track slot according to the sequence for checking; and storing the block information for different memory regions into the time track slot according to the sequence for checking; in response to the memory region starting to be written with data, inserting the block information for the memory region into the tail of the time track slot, and establishing the time node information for the memory region, the time period corresponding to the time difference between the writing and reading of the same data in the time node information changes with the time track in the time track slot.

In the scheme described above, the method further comprises: after the depth of the time track slot reaches a third depth, when at least one of a change of the program location or a change of the memory region in which the program location is located is checked every second preset time duration, deleting at least one of the program address information or block information corresponding to the head in the time track slot, and inserting at least one of new program address information or block information into the tail of the time track slot to update the time track slot and maintain the time track slot at the third depth; wherein, a third depth is determined according to a second target time interval and the second preset time duration; the second target time interval is the boundary value between the first time period and the second time period which are adjacent, and in the first time period, the amount of the voltage shift is zero; and in the second time period, the amount of the voltage shift is not zero.

In the scheme described above, the method further comprises: recording the first time at which each memory region starts to be written with data and the second time at which each memory region is fully written with data; in response to the read command, obtaining the first time for the memory region in which the data to be read is located; determining the type of the memory region in which the data to be read is located according to the system time of the memory system and the first time for the memory region in which the data to be read is located; in response to the memory region in which the data to be read is located being a memory region not fully written with data, obtaining a first program address information corresponding to the last programming of the memory device when the read command is received; and updating the first program address information to the third time period into the time node information for the memory region in which the data to be read is located.

According to an example of the present disclosure a readable storage medium is further provided, the readable storage medium having a computer program stored thereon, which when executed, may implement any one of the operating methods described above.

Examples of the present application provide a memory system, an operating method, and a readable storage medium. Wherein the memory system comprises: a memory device and a memory controller coupled to the memory device; wherein, the memory controller is configured to: in response to a read command, determine a time period to which a time difference between writing and reading of data to be read corresponding to the read command belongs; determine the amount of the voltage shift according to the time period to which the time difference between the writing and reading of the data to be read belongs; and determine a read voltage for reading the data to be read based on the amount of the voltage shift and the default read voltage. The memory system provided by the example of the present application determines the amount of the voltage shift by determining the time period to which the time difference between the writing and reading of the data to be read belongs, and then determine the read voltage for the data to be read with the amount of the voltage shift and the default read voltage, thus, the Initial Threshold Shift (IVS) effect of the memory cell is actively processed to ensure that the probability of a successful read in one time is relatively high and meet high Quality of Service (QOS) requirements.

It should be noted that the above description is intended to be illustrative and not limiting. For example, the examples described above (or one or more aspects thereof) may be used in combination with each other. Other examples may be used, such as those available to one of ordinary skill in the art upon reading the above description. It should be understood that it will not be used to interpret or limit the scope or meaning of the claims. Furthermore, in the above detailed description, various features may be combined together to simplify the present disclosure. This should not be construed to mean that an unclaimed disclosed feature is essential to any claim. Rather, disclosed subject matter may lie in less than all features of a particular disclosed example. Therefore, the following claims are hereby incorporated into the Detailed Description, with each claim standing on its own as a separate example, and it is contemplated that these examples may be combined with one another in various combinations or permutations. The scope of the present disclosure should be determined with reference to the appended claims, along with the full scope of equivalents to which such claims are entitled.

What is claimed is:

1. A memory system, comprising:
a memory device; and
a memory controller coupled to the memory device and configured to:
in response to a read command, determine a time period to which a time difference between writing and reading of data to be read corresponding to the read command belongs;
determine an amount of a voltage shift according to the time period to which the time difference between the writing and reading of the data to be read belongs; and
determine a read voltage for reading the data to be read based on the amount of the voltage shift and a default read voltage.

2. The memory system of claim 1, wherein the time period is to reflect a degree of an initial threshold shift (IVS) corresponding to a memory cell storing data in the memory device, and memory cells in different time periods correspond to different degrees of the IVS, and the memory controller is further configured to determine the amount of the voltage shift according to the time period to which the time difference between the writing and reading of the data to be read belongs and a mapping relationship, wherein the mapping relationship includes multiple sub-mapping relationships of the multiple sub-mapping relationships, and each sub-mapping relationship of the multiple sub-mapping relationships includes a corresponded relationship between the time period and corresponding amount of the voltage shift.

3. The memory system of claim 1, wherein the memory controller is further configured to:
check a program location in which the memory device is located every first preset time duration, and when different program locations are checked, store a program address information for the different program locations in a first queue according to a sequence for checking; and
in response to the read command, determine the time period to which the time difference between the writing and reading of the data to be read belongs according to the program address information in the first queue and a read address information corresponding to the read command.

4. The memory system of claim 3, wherein the program address information in the first queue is divided according to the time period to form at least one first group of data, and the memory controller is further configured to:
compare the read address information with the program address information in the first queue to determine the first group of data in which the read address information is located; and
determine the time period to which the time difference between the writing and reading of the data to be read belongs based on the first group of data in which the read address information is located.

5. The memory system of claim 3, wherein the memory controller is further configured to:
after a depth of the first queue reaches a first depth, and when a change of the program location in which the memory device is located is checked every of a first preset time duration, delete program address information corresponding to a head of the first queue; and
insert new program address information into a tail of the first queue to update the first queue and maintain the first queue at the first depth, wherein, the first depth is determined according to a first target time interval and the first preset time duration, the first target time interval is a boundary value between a first time period and a second time period which are adjacent, and, in the first time period, the amount of the voltage shift is zero, and, in the second time period, the amount of the voltage shift is not zero.

6. The memory system of claim 5, wherein the depth of the first queue reaches the first depth, and the memory controller is further configured to:
obtain, as a first program address information, the program address information corresponding to a last programming of the memory device when the read command is received;
compare the first program address information with the program address information in the first queue; and
in response to the first program address information being the same as the program address information corresponding to the head of the first queue, determine the time period to which the time difference between the writing and reading of the data to be read belongs to be the first time period.

7. The memory system of claim 6, wherein the program address information in the first queue is divided according to the time period to form at least one first group of data, and the memory controller is further configured to:

in response to the first program address information being different from the program address information corresponding to the head of the first queue, compare the read address information with the program address information in the first queue; and in response to the read address information being the same as a second program address information in the first queue:

determine the first group of data in which the read address information is located; and determine the time period to which the time difference between the writing and reading of the data to be read belongs based on the first group of data in which the read address information is located.

8. The memory system of claim 5, wherein the depth of the first queue does not reach the first depth, the program address information in the first queue is divided according to the time period to form at least one first group of data, and the memory controller is further configured to:

compare the read address information with the program address information in the first queue to determine the first group of data in which the read address information is located; and determine the time period to which the time difference between the writing and reading of the data to be read belongs based on the first group of data in which the read address information is located.

9. The memory system of claim 7, wherein the memory device includes a plurality of memory regions, each memory region of the plurality of memory regions includes a plurality of memory pages, the program address information is address information for a memory page of the plurality of memory pages into which data is written, and the memory controller is further configured to:

store corresponding block information in a second queue according to the sequence in which data is written to the memory region; and after a depth of the second queue reaches a second depth, in response to data being written into a new memory region:

delete block information for the memory region corresponding to a head of the second queue; and insert block information for the new memory region into a tail of the second queue to update the second queue and maintain the second queue at the second depth, wherein the second depth is greater than or equal to the first depth.

10. The memory system of claim 7, wherein the memory device includes a plurality of memory regions, each memory region of the plurality of memory regions includes a plurality of memory pages, the program address information is address information for a memory page of the plurality of memory pages into which data is written, and the memory controller is further configured to determine the time period to which the time difference between the writing and reading of the data to be read belongs according to a system time of the memory system, at least one of first time or second time, wherein, the first time is a recorded time at which the memory region in which the data to be read is located starts to be written with data, and the second time is a recorded time at which the memory region in which the data to be read is located is fully written.

11. The memory system of claim 7, wherein the memory device includes a plurality of memory regions, each memory region of the purality of memory regions includes a plurality of memory pages, the program address information is address information for a memory page of the plurality of memory pages into which data is written, and the memory controller is further configured to:

determine block information corresponding to a memory region in which the program address information in the first queue is located;

store the block information in a third queue according to the sequence in which the program address information is recorded in the first queue, wherein a depth of the third queue is the same as the depth of the first queue;

divide the block information in the third queue according to the time period to form at least one third group of data; and in response to the memory region in which the data to be read is located being a memory region fully written with data:

determine the third group of data to which the memory region in which the data to be read is located belongs according to a system time of the memory system and a first time or a second time; and determine the time period to which the time difference between the writing and reading of the data to be read belongs according to the third group of data to which the memory region in which the data to be read is located belongs, wherein, the first time is a recorded time at which the memory region in which the data to be read is located starts to be written with data, and the second time is the recorded time at which the memory region in which the data to be read is located is fully written.

12. The memory system of claim 2, wherein the memory controller is further configured to:

in response to the read command, determine a memory region in which the data to be read is located;

obtain time node information corresponding to the memory region in which the data to be read is located; and obtain the time period to which the time difference between the writing and reading of the data to be read belongs according to the time node information and a read address information corresponding to the read command, wherein the time node information is to indicate the time period to which the time difference between the writing and reading of the data to be written into the memory region belongs.

13. A method of operating a memory system, comprising:

in response to receiving a read command, determining a time period to which a time difference between writing and reading of data to be read corresponding to the read command belongs;

determining an amount of a voltage shift according to the time period to which the time difference between the writing and reading of the data to be read belongs; and determining a read voltage for reading the data to be read according to the amount of the voltage shift and a default read voltage.

14. The method of claim 13, wherein the time period is to reflect a degree of an initial threshold shift IVS corresponding to a memory cell storing data in a memory device in the memory system, memory cells in different time periods correspond to different degrees of the IVS, and the determining the amount of the voltage shift according to the time period to which the time difference between the writing and reading of the data to be read belongs includes determining the amount of the voltage shift according to the time period to which the time difference between the writing and reading of the data to be read belongs and a mapping relationship, wherein the mapping relationship includes multiple sub-mapping relationships, and each sub-mapping relationship of the multiple mapping relationships includes a corresponding relationship between the time period and corresponding amount of the voltage shift.

15. The method of claim 13, further including:

checking a program location in which a memory device is located every of a first preset time duration;

when different program locations are checked, storing a program address information for the different program locations in a first queue according to a sequence for checking; and determining the time period to which the time difference between writing and reading of data to be read corresponding to the read command belongs includes determining the time period to which the time difference between the writing and reading of the data to be read belongs according to the program address information in the first queue and read address information corresponding to the read command.

16. The method of claim 15, wherein the program address information in the first queue is divided according to the time period to form at least one first group of data, and the determining the time period to which the time difference between the writing and reading of the data to be read belongs according to the program address information in the first queue and the read address information corresponding to the read command includes:

comparing the read address information with the program address information in the first queue to determine the first group of data in which the read address information is located; and determining the time period to which the time difference between writing and reading of the data to be read belongs based on the first group of data in which the read address information is located.

17. The method of claim 15, further including, after a depth of the first queue reaches a first depth, and when a change of the program location in which the memory device is located is checked every of the first preset time duration:

deleting the program address information corresponding to a head of the first queue; and inserting new program address information into a tail of the first queue to update the first queue and maintain the first queue at the first depth, wherein the first depth is determined according to a first target time interval and the first preset time duration, the first target time interval is a boundary value between a first time period and a second time period which are adjacent, in the first time period, the amount of the voltage shift is zero, and, in the second time period, the amount of the voltage shift is not zero.

18. The method of claim 17, wherein the depth of the first queue reaches the first depth, and the method further includes:

obtaining, as a first program address information, the program address information corresponding to a last programming of the memory device when the read command is received;

comparing the first program address information with the program address information in the first queue; and in response to the first program address information being the same as the program address information corresponding to the head of the first queue, determining the time period to which the time difference between the writing and reading of the data to be read belongs to be the first time period.

19. The method of claim 18, wherein the program address information in the first queue is divided according to the time period to form at least one first group of data, and the method further includes:

in response to the first program address information being different from the program address information corresponding to the head of the first queue, comparing the read address information with the program address information in the first queue; and in response to the read address information being the same as second program address information in the first queue:

determining the first group of data in which the read address information is located; and determining the time period to which the time difference between the writing and reading of the data to be read belongs based on the first group of data in which the read address information is located.

20. A readable storage medium having a computer program storing thereon, which when executed, implements a method for operating a memory system, comprising:

in response to receiving a read command, determining a time period to which a time difference between writing and reading of data to be read corresponding to the read command belongs;

determining an amount of a voltage shift according to the time period to which the time difference between the writing and reading of the data to be read belongs; and determining a read voltage for reading the data to be read according to the amount of the voltage shift and a default read voltage.

\* \* \* \* \*